(12) United States Patent
Kato et al.

(10) Patent No.: US 8,394,689 B2
(45) Date of Patent: Mar. 12, 2013

(54) SEMICONDUCTOR MEMORY DEVICE WITH STACKED GATE INCLUDING CHARGE STORAGE LAYER AND CONTROL GATE AND METHOD OF MANUFACTURING THE SAME

(75) Inventors: Yoshiko Kato, Yokohama (JP); Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/426,664

(22) Filed: Mar. 22, 2012

(65) Prior Publication Data

US 2012/0178229 A1 Jul. 12, 2012

Related U.S. Application Data

(62) Division of application No. 12/338,417, filed on Dec. 18, 2008, now Pat. No. 8,159,019.

(30) Foreign Application Priority Data

Dec. 25, 2007 (JP) ................................. 2007-333306

(51) Int. Cl.
*H01L 29/72* (2006.01)
(52) U.S. Cl. ........ 438/197; 438/221; 438/296; 438/404; 438/524; 438/585; 438/700; 438/778
(58) Field of Classification Search .................. 438/197, 438/221, 296, 404, 524, 585, 700, 778
See application file for complete search history.

(56) References Cited

U.S. PATENT DOCUMENTS

| 6,835,987 | B2 | 12/2004 | Yaegashi |
| 6,933,215 | B2 * | 8/2005 | Bromberger et al. ......... 438/527 |
| 7,876,610 | B2 | 1/2011 | Gomikawa et al. |
| 2007/0048967 | A1 | 3/2007 | Kohyama |
| 2007/0208903 | A1 | 9/2007 | Gomikawa et al. |
| 2007/0249123 | A1 * | 10/2007 | Chou et al. ..................... 438/270 |
| 2007/0272986 | A1 | 11/2007 | Williams et al. |
| 2010/0314677 | A1 | 12/2010 | Kato et al. |
| 2011/0108901 | A1 | 5/2011 | Matsunami et al. |

FOREIGN PATENT DOCUMENTS

| JP | 10-4137 | 1/1998 |
| JP | 2000-340791 A | 12/2000 |
| JP | 2003-60073 A | 2/2003 |
| JP | 2004-349393 A | 12/2004 |
| JP | 2007-27622 A | 2/2007 |

OTHER PUBLICATIONS

Office Action issued Jul. 10, 2012, in Japanese Patent Application No. 2007-333306 with English translation.

* cited by examiner

*Primary Examiner* — Edward Wojciechowicz
(74) *Attorney, Agent, or Firm* — Oblon, Spivak, McClelland, Maier & Neustadt, L.L.P.

(57) ABSTRACT

A semiconductor memory device includes a first active region, a second active region, a first element isolating region and a second element isolating region. The first active region is formed in a semiconductor substrate. The second active region is formed in the semiconductor substrate. The first element isolating region electrically separates the first active regions adjacent to each other. The second element isolating region electrically separates the second active regions adjacent to each other. An impurity concentration in a part of the second active region in contact with a side face of the second element isolating region is higher than that in the central part of the second active region, and a impurity concentration in a part of the first active region in contact with a side face of the first element isolating region is equal to that in the first active region.

8 Claims, 19 Drawing Sheets

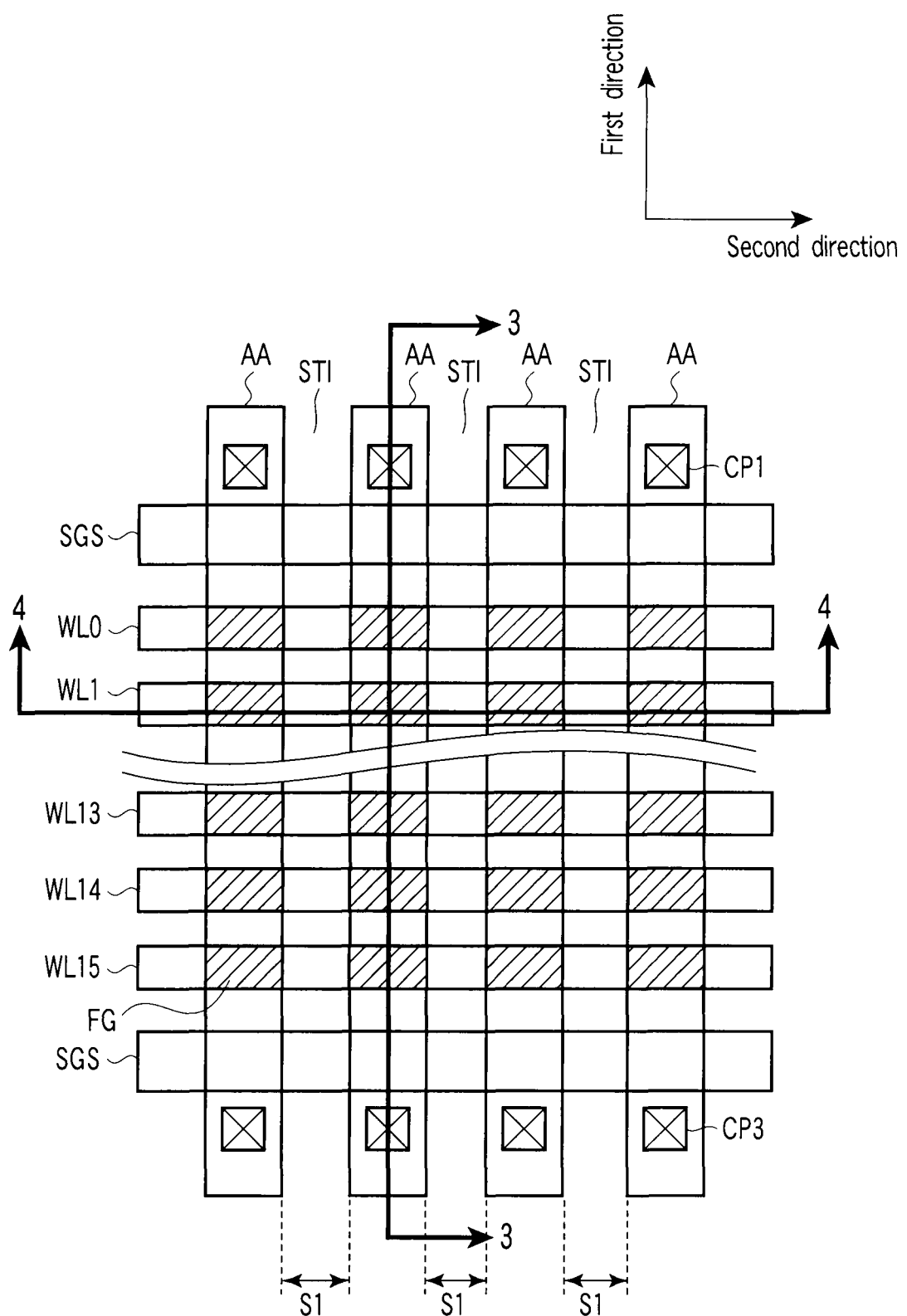
F I G. 2

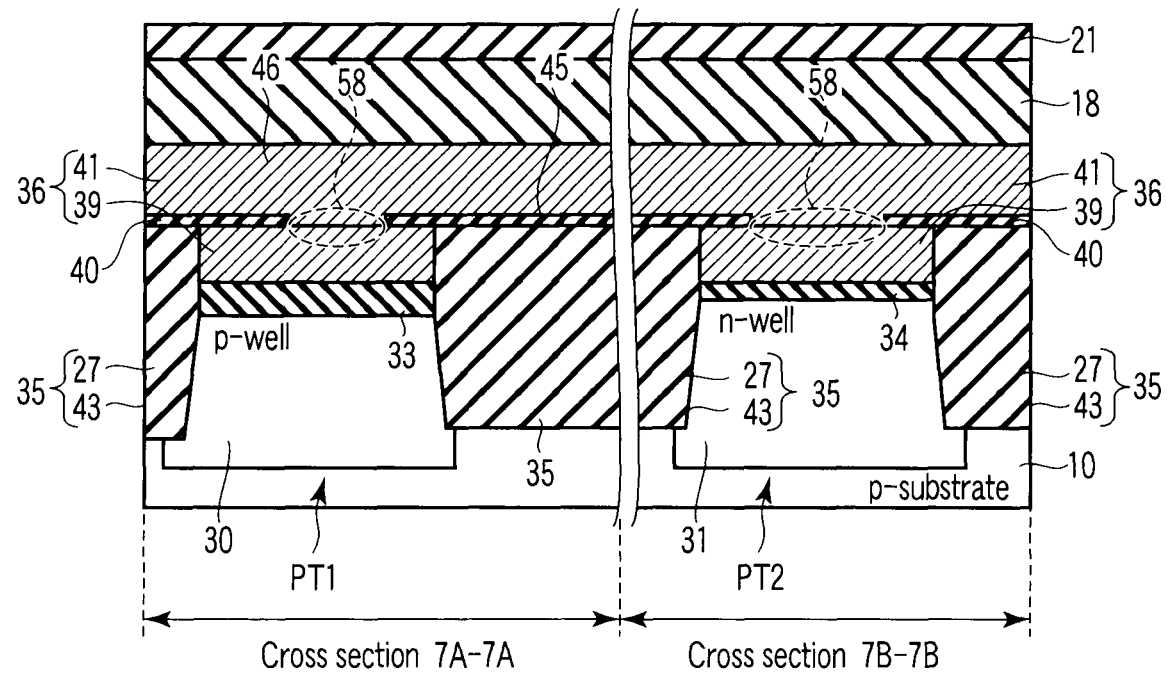
F I G. 7
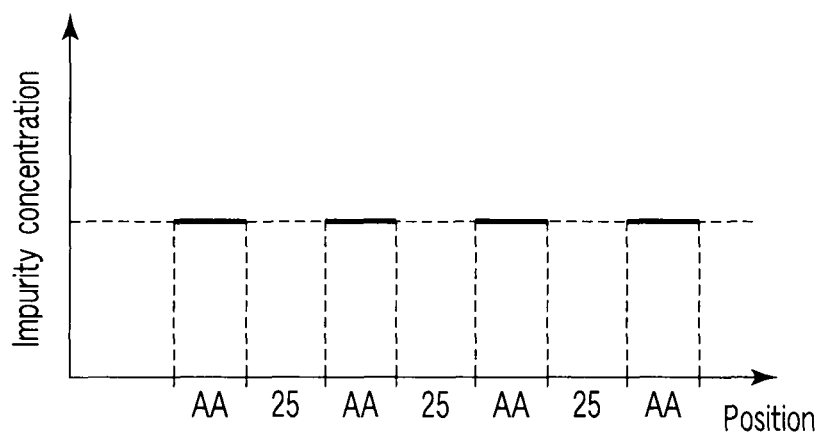
F I G. 8

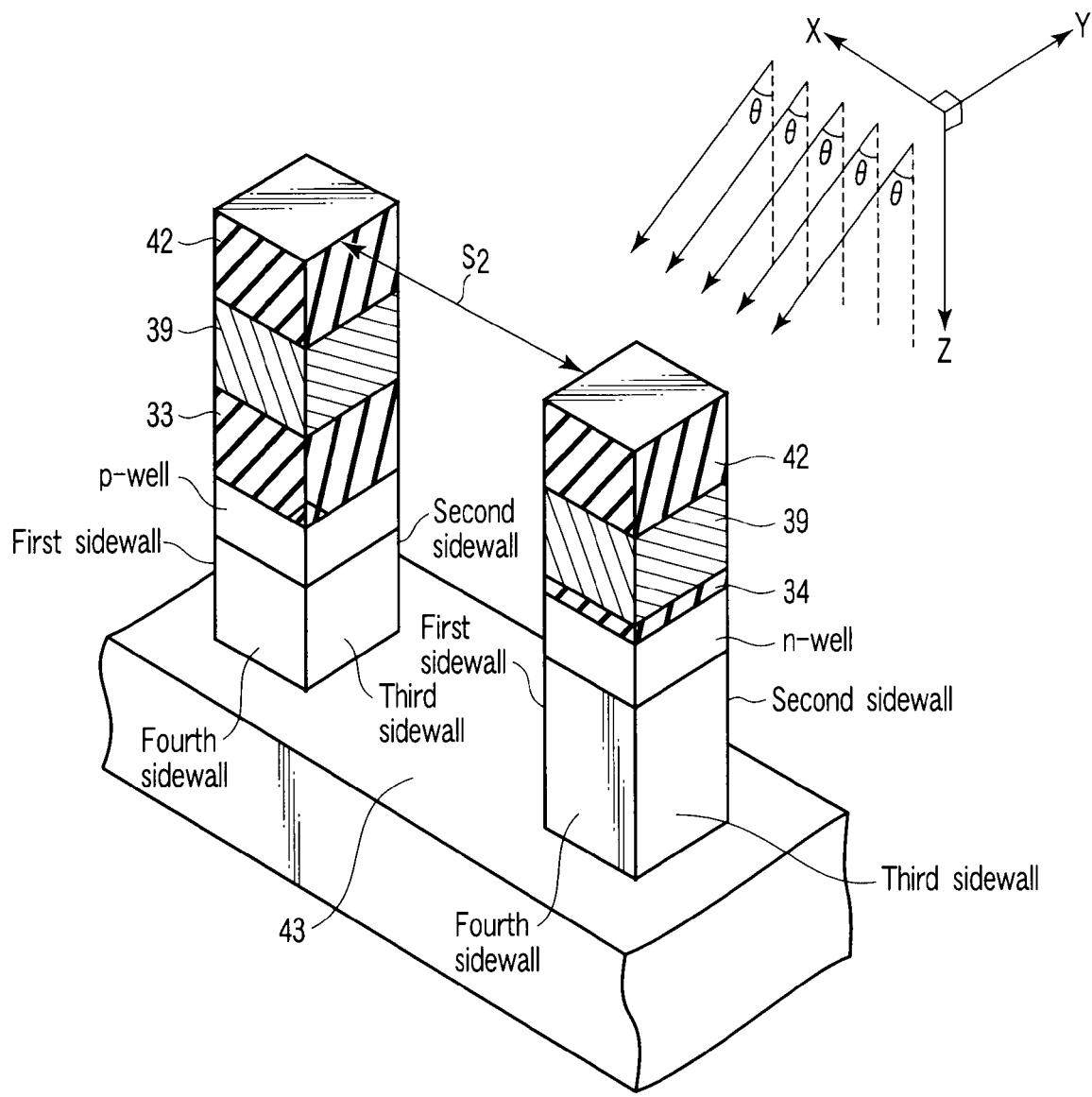
F I G. 14

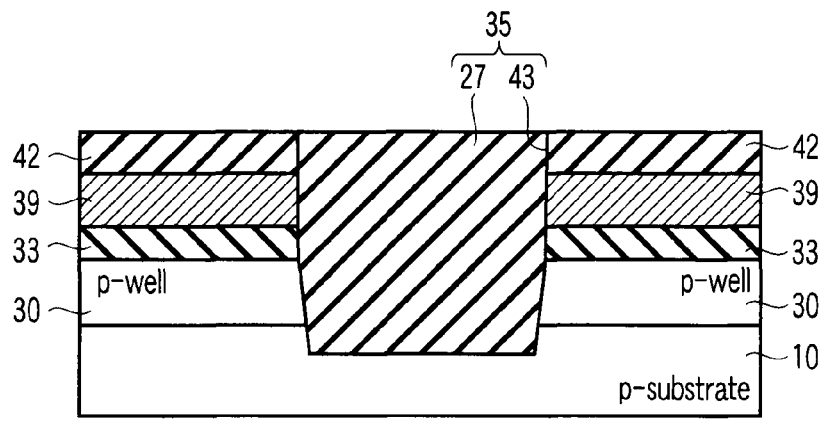
F I G. 17 A
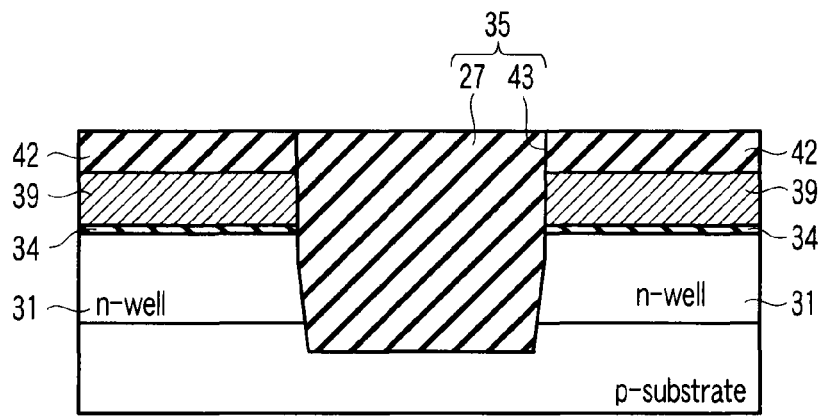
F I G. 17 B
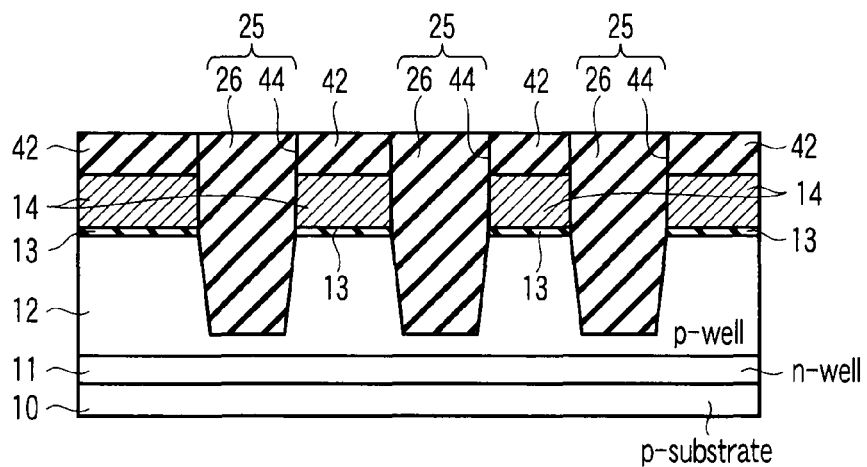
F I G. 17 C

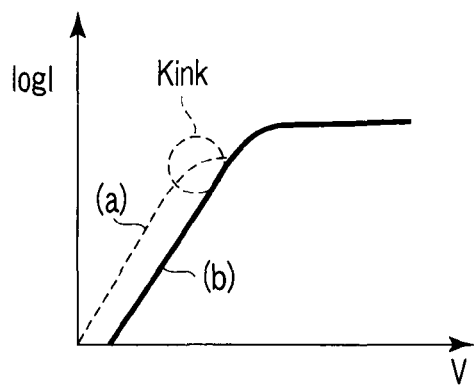
F I G. 19
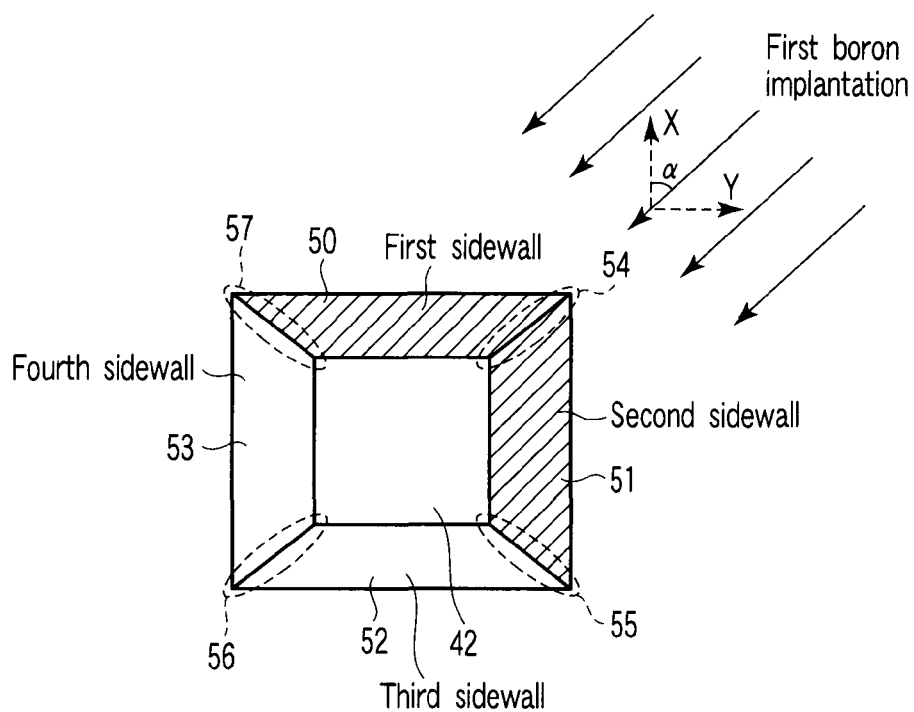
F I G. 20

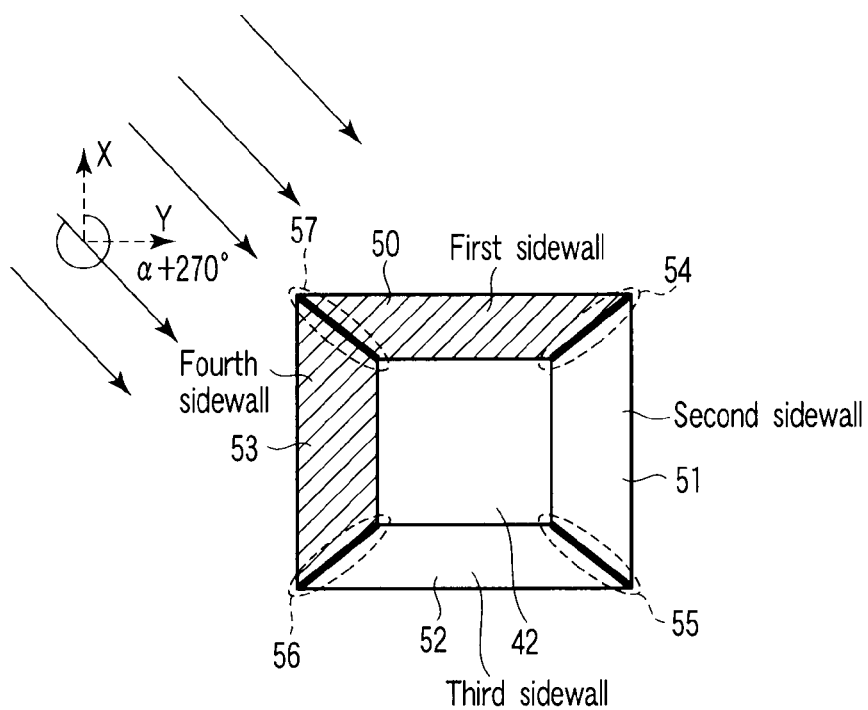
F I G. 2 3
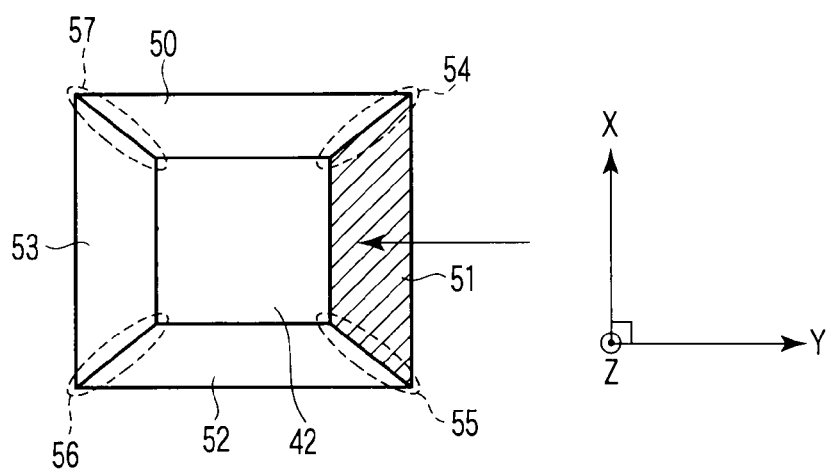
F I G. 2 4

SEMICONDUCTOR MEMORY DEVICE WITH STACKED GATE INCLUDING CHARGE STORAGE LAYER AND CONTROL GATE AND METHOD OF MANUFACTURING THE SAME

CROSS-REFERENCE TO RELATED APPLICATIONS

This application is a division of and claims the benefit of priority under 35 U.S.C. §120 from U.S. Ser. No. 12/338,417 filed Dec. 18, 2008, and claims the benefit of priority under 35 U.S.C. §119 from Japanese Patent Application No. 2007-333306 filed Dec. 25, 2007, the entire contents of each of which are incorporated herein by reference.

BACKGROUND OF THE INVENTION

1. Field of the Invention

This invention relates to a semiconductor memory device and a method of manufacturing the same, and more particularly to the implantation of impurities into the sidewalls of an active region.

2. Description of the Related Art

A semiconductor memory device requires not only memory cell transistors but also peripheral transistors constituting a power generating circuit, a decoder circuit, and the like.

The peripheral transistors include low-voltage MOS transistors which use, for example, a voltage VDD (e.g. 1.5V) as a power supply voltage and high-voltage MOS transistors which use, for example, a voltage VPP (e.g., 20V), which is higher than the power supply voltage of the low-voltage MOS transistors, as a power supply voltage.

In the processes of manufacturing peripheral transistors, the process of forming element isolating regions which electrically isolate the peripheral transistors begins with the step of making trenches. A method of using RIE (reactive ion etching) in the step has been disclosed in, for example, Jpn. Pat. Appln. KOKAI Publication No. 10-4137.

However, in the process of performing RIE, there arise such problems as damage to the sidewall of the active region and the storage of positive charge at the interface of the active region. As the elements are miniaturized further, the effect of these problems cannot be ignored. That is, as the miniaturization proceeds, the sidewall of the active region is more liable than the area directly under the gate to be reversed into the on state, even at a low voltage, with the result that the leakage current flowing in the sidewall of the active region increases. The effect appears significantly in a high-voltage n-type MOS transistor which uses a p-well region with a relatively low impurity concentration or a p-type semiconductor substrate.

BRIEF SUMMARY OF THE INVENTION

A semiconductor memory device according to an aspect of the present invention includes a first active region which is formed in a semiconductor substrate and in which a first MOS transistor that has a stacked gate including a charge storage layer and a control gate is arranged; a second active region which is formed in the semiconductor substrate and in which a second MOS transistor is arranged; a first element isolating region which electrically separates the first active regions adjacent to each other and which includes a first insulating film buried in a first trench made in the semiconductor substrate, the first insulating film making contact with the first active region in the sidewall part of the first trench; and a second element isolating region which electrically separates the second active regions adjacent to each other and which includes a second insulating film buried in a second trench made in the semiconductor substrate, the second insulating film making contact with the second active region in the sidewall part of the second trench, the impurity concentration in a part of the second active region in contact with the side face of the second element isolating region being higher than that in the central part of the second active region, and the impurity concentration in a part of the first active region in contact with the side face of the first element isolating region being equal to that in the first active region.

A semiconductor memory device manufacturing method according to an aspect of the present invention includes forming a first gate insulating film and a second gate insulating film on a first region in which a memory cell transistor is to be formed, and on a second region in which a peripheral transistor for controlling the memory cell transistor is to be formed on a semiconductor substrate, respectively; forming a first conductive layer on each of the first gate insulating film and second gate insulating film; forming a mask material on the first conductive layer; making a first trench which passes through the mask material, first conductive layer, and first gate insulating film in the first region and reaches the inside of the semiconductor substrate and a second trench which passes through the mask material, first conductive layer, and second gate insulating film in the second region and has a bottom face that reaches the inside of the semiconductor substrate and a side face in contact with the bottom face and which has a greater width than that of the first trench; implanting impurities into the side face of the second region by implanting ions into the first trench and second trench in a direction deviating from a normal line to the bottom face by an acute angle to the side face; forming a first element isolating region by burying a first insulating film in the first trench; forming a second element isolating region by burying a second insulating film in the second trench; removing the mask material after forming the first element isolating region and second element isolating region; forming a third insulating film on the first conductive layer; forming a second conductive layer on the third insulating film; and forming the memory cell transistor and peripheral transistor by patterning the second conductive layer, first insulating film, first conductive layer, first gate insulating film, and second gate insulating film.

BRIEF DESCRIPTION OF THE SEVERAL VIEWS OF THE DRAWING

FIG. 2 is a plan view of a memory cell array included in the NAND flash memory according to the first embodiment;

FIG. 7 is a sectional view taken along line 7A-7A or line 7B-7B of FIG. 5;

FIG. 8 is a diagram of boron concentration distribution along line 4-4 of FIG. 2;

FIG. 14 is a perspective view of the peripheral transistor shown in the manufacturing step in FIGS. 12A and 12B of the semiconductor device according to the first embodiment;

FIGS. 17A to 17C are sectional views to help explain a third manufacturing step of the semiconductor device according to the first embodiment, FIGS. 17A and 17B being sectional views of the peripheral transistor taken along the gate width and FIG. 17C being a sectional view of the memory cell transistor taken along line 4-4 of FIG. 2;

FIG. 19 is a graph showing an I-V characteristic of the semiconductor device according to the first embodiment, (a) showing a conventional I-V characteristic and (b) showing an I-V characteristic of the semiconductor memory device according to the first embodiment;

FIG. 20 is a top view of a peripheral transistor shown in the manufacturing step in either FIG. 12A or 12B of a semiconductor device according to a second embodiment of the invention, showing a state where implantation has been performed at an angle of α=45 degrees;

FIG. 23 is a top view of the peripheral transistor shown in the manufacturing step in either FIG. 12A or 12B of the semiconductor device according to the second embodiment, showing a state where implantation has been performed at an angle of α=315 degrees;

FIG. 24 is a top view of the peripheral transistor shown in the manufacturing step in either FIG. 12A or 12B of the semiconductor device according to the second embodiment, showing a state where implantation has been performed at an angle of α=0 degree;

DETAILED DESCRIPTION OF THE INVENTION

First Embodiment

Figure 1:
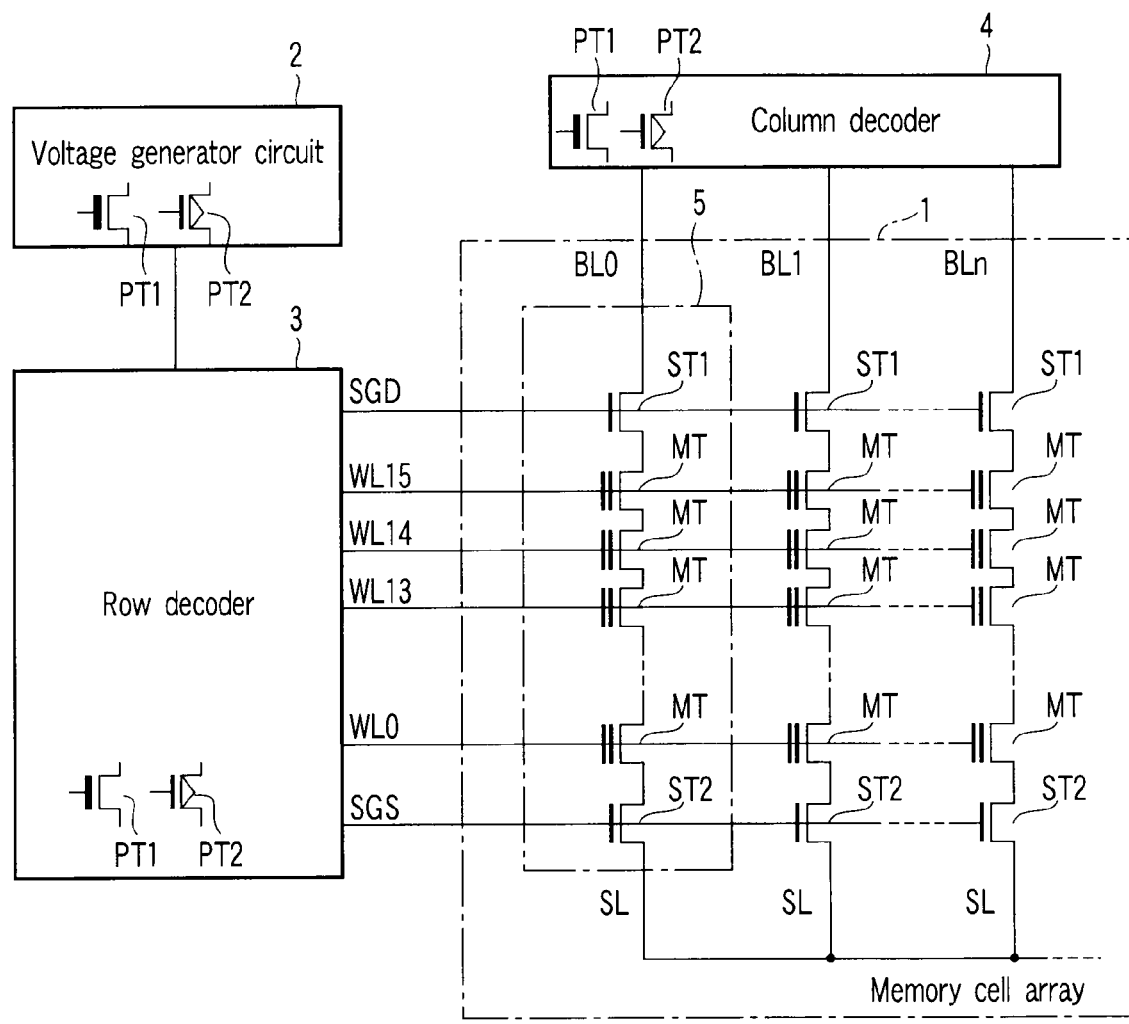
FIG. 1 is a block diagram of a NAND flash memory according to a first embodiment of the invention.

A semiconductor memory device and a method of manufacturing the semiconductor memory device according to a first embodiment of the invention will be explained using FIG. 1. FIG. 1 is a block diagram of a NAND flash memory according to the first embodiment.

As shown in FIG. 1, the NAND flash memory comprises a memory cell array 1, a voltage generator circuit 2, a row decoder 3, and a column decoder 4. First, the memory cell array 1 will be explained.

As shown in FIG. 1, the memory cell array 1 includes a plurality of NAND cells 5 each composed of nonvolatile memory cells connected in series. Each of the NAND cells 5 includes, for example, 16 memory cell transistors MT, a select transistor ST1, and a select transistor ST2. Each of the memory cell transistors MT has a stacked gate structure which includes a charge storage layer (e.g., a floating gate) formed above a semiconductor substrate via a gate insulating film and a control gate electrode formed above the floating gate via an inter-gate insulating film. The number of memory cell transistors MT is not limited to 16 and may be 8, 32, 64, 128, 256, and the like. Adjacent memory cell transistors MT share a source and a drain. The memory cell transistors MT are arranged between the select transistors ST1, ST2 in such a manner that their current paths are connected in series. The drain region on one end side of the series-connected memory cell transistors MT is connected to the source region of the select transistor ST1. The source region on the other end side is connected to the drain region of the select transistor ST2.

The control gate electrodes of the memory cell transistors MT in the same row are connected to any one of word line WL0 to word line WL15 in a common connection manner. The gate electrodes of the select transistors ST1 of the memory cells in the same row are connected to a select gate line SGD in a common connection manner. The gate electrodes of the select transistors ST2 of the memory cells in the same row are connected to a select gate line SGS in a common connection manner. To simplify the explanation, when word line WL0 to word line WL15 are not distinguished, they may be referred to as the word lines WL. In the memory cell array 1, the drains of the select transistors in the same column are connected to any one of bit line BL0 to bit line BLn (n is a natural number) in a common connection manner. Hereinafter, when bit line BL0 to bit line BLn are not distinguished, they may be referred to as the bit lines BL. The sources of the select transistors ST2 are connected to a source line SL in a common connection manner. Both of the select transistors ST1, ST2 are not necessarily needed. Only either the select transistors ST1 or ST2 may be used, provided that the NAND cells 5 can be selected.

In FIG. 1, only one row of NAND cells 5 is shown. In the memory cell array 1, a plurality of rows of NAND cells 5 may be provided. In this case, the NAND cells 5 in the same column are connected to the same bit line BL. Data is written into a plurality of memory cell transistors MT connected to the same word line WL at the same time. This writing unit is called a page. Data is erased from a plurality of NAND cells 5 in the same row at the same time. This erasing unit is called a memory block.

The row decoder 3 selects the row direction in the memory cell array 1. Specifically, the row decoder selects a word line WL and applies a voltage to the selected word line WL.

The column decoder 4 selects the column direction in the memory cell array 1. Specifically, the column decoder selects a bit line BL.

The voltage generator circuit 2 generates a voltage and supplies the generated voltage to the row decoder.

The voltage generator circuit 2, row decoder 3, and column decoder 4 include low-voltage MOS transistors which use, for example, a voltage of VDD (e.g. 1.5V) as a power supply voltage, and high-voltage MOS transistors which use, for example, a voltage VPP (e.g., 20V), which is higher than the power supply voltage of the low-voltage MOS transistor, as a power supply voltage. To simplify the explanation, hereinafter, only n-channel MOS transistors will be explained as high-voltage MOS transistors and referred to as peripheral transistors PT1 and only p-channel MOS transistors will be explained as low-voltage MOS transistors and referred to as peripheral transistors PT2.

Figure 3:
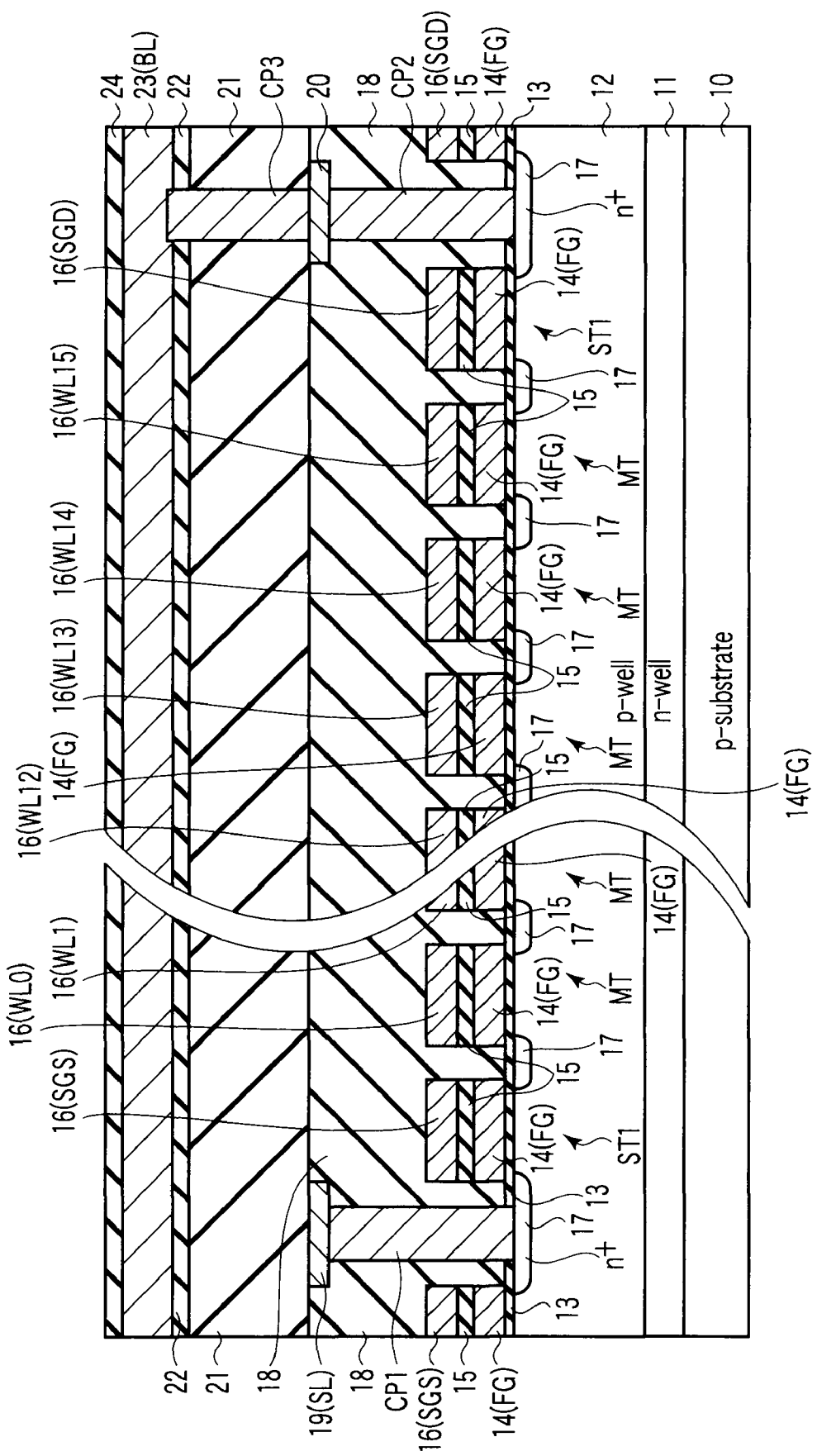
FIG. 3 is a sectional view taken along line 3-3 of FIG. 2.
Figure 4:
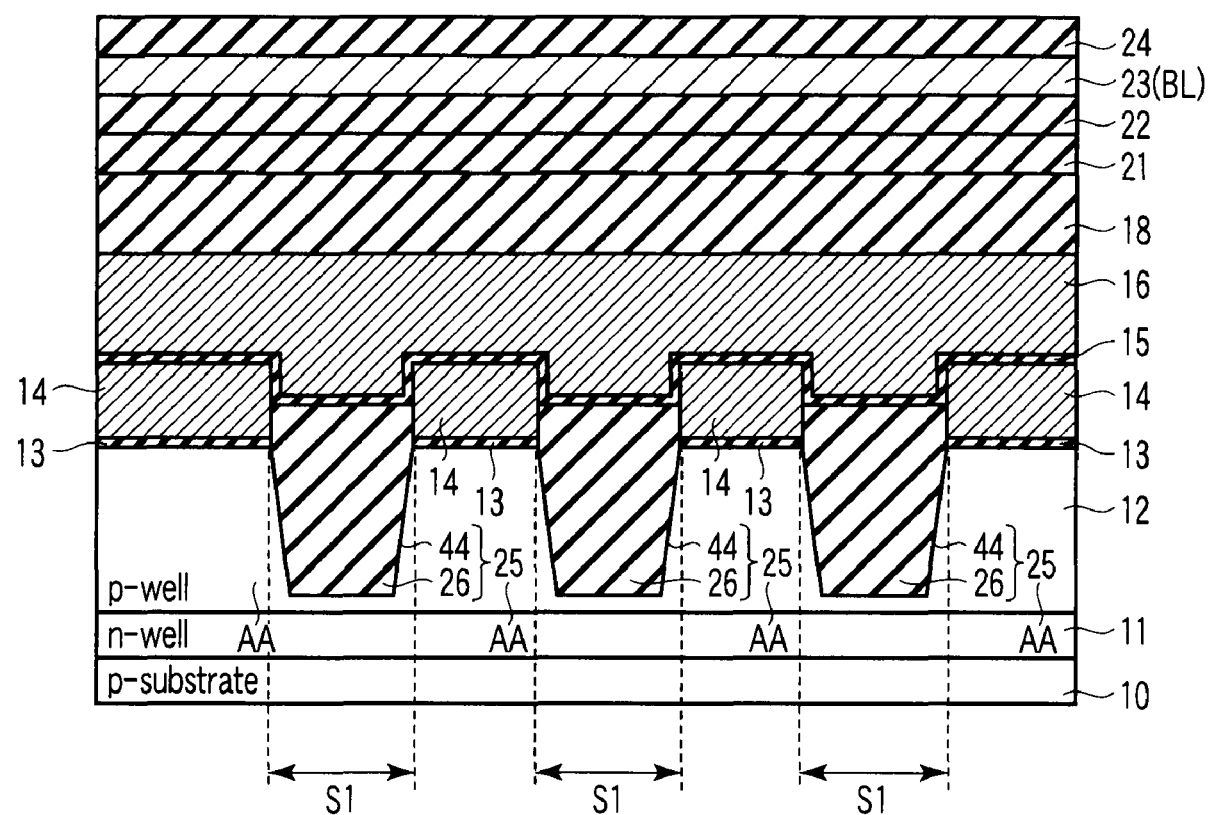
FIG. 4 is a sectional view taken along line 4-4 of FIG. 2.

Next, using FIGS. 2 to 4, a planar configuration and a sectional structure of the memory cell array 1 will be explained. FIG. 2 is a plan view of the memory cell array 1. FIG. 3 is a sectional view taken along line 3-3 of FIG. 2. FIG. 4 is a sectional view taken along line 4-4 of FIG. 2. FIG. 3 is a sectional view of a NAND cell 5 taken along line 3-3 of FIG. 2. FIG. 4 is a sectional view of the NAND cell 5 taken along line 4-4 of FIG. 2.

As shown in FIG. 2, a plurality of element isolating regions 25 extending in a first direction are arranged in a second direction at intervals of S1. Active regions AA extending in the first direction are formed so as to be isolated by the element isolating regions 25 (represented as STI). A plurality of word lines WL extending in the second direction are arranged at specific intervals in the first direction. The select gate lines SGD and SGD are arranged so as to sandwich the word lines WL between them. At the intersections of the active regions AA and word lines WL and at the intersections of the active regions AA and select gate lines SGD, SGD, memory cell transistors MT and select gate transistors ST are formed.

As shown in FIGS. 3 and 4, an n-well region 11 is formed at the surface of a p-type semiconductor substrate 10. A p-well region 12 is formed on the n-well region 11. In the p-well region 12, a plurality of trenches 44 are made in the second direction of FIG. 2. In each of the trenches 44, an insulating film 26 is buried in the trench 44 using, for example, a silicon dioxide film. The insulating films 26 constitute the element isolating regions 25. A region between adjacent element isolating regions 25 is an active region AA. On the active region AA, a gate insulating film 13 is formed.

On the gate insulating film 13, the gate electrodes of the memory cell transistors MT and select transistors ST1, ST2 are formed.

The gate electrode of each of the memory cell transistors MT and select transistors ST1, ST2 has a conductive layer 14 formed on the gate insulating film 13, an insulating film 15 formed on the conductive layer 14, and a conductive layer 16 formed on the insulating film 15. The insulating film 15, which is composed of, for example, a silicon dioxide film or a stacked structure of a silicon dioxide film and a silicon nitride film, is in contact with the top face and side face of the conductive layer 14 and is formed on the top face of the element isolating region 25.

In the memory cell transistor MT, the gate insulating film 13 functions as a tunnel insulating film. The conductive layer 14 functions as a floating gate (FG). The conductive layers 16 adjacent in a second direction perpendicular to the first direction of FIG. 2 are connected to each other in a common connection manner. They function as control gate electrodes (word lines WL). Hereinafter, the conductive layers 14 and 16 may be referred to as the charge storage layer 14 and control gate 16, respectively. In the select transistors ST1, ST2, the conductive layers 14 adjacent in the second direction are connected to each other in a common connection manner. The conductive layers 14 function as select gate lines SGS, SGD. Only the conductive layers 16 may function as select gate lines. In this case, the potential of the conductive layers 16 of the select transistors ST1, ST2 is set to a specific potential or in a floating state.

As shown in FIG. 3, at the surface of the p-type semiconductor substrate 10 located between the gate electrodes, an $n^+$-type impurity diffused layer 17 is formed. The $n^+$-type impurity diffused layer 17, which is shared by adjacent transistors, functions as a source (S) or a drain (D). A region between the source and drain adjacent to each other functions as a channel region acting as an electron moving region. These gate electrodes, $n^+$-type impurity diffused layers 17, and channel regions form MOS transistors constituting the memory cell transistors MT and select transistors ST1, ST2.

On the p-type semiconductor substrate 10, an interlayer insulating film 18 is formed so as to cover the memory cell transistors MT and select transistors ST1, ST2. In the interlayer insulating film 18, a contact plug CP1 reaching the impurity diffused layer (source) 17 of the select transistor ST2 on the source side is formed. At the surface of the interlayer insulating film 18, a metal wiring layer 19 connected to the contact plug CP1 is formed. The metal wiring layer 19 functions as a part of the source line SL. Further in the interlayer insulating film 18, a contact plug CP2 reaching the $n^+$ impurity diffused layer (drain) 17 of the select transistor ST1 on the drain side is formed. At the surface of the interlayer insulating film 18, a metal wiring layer 20 connected to the contact plug CP2 is formed.

On the interlayer insulating film 18, an interlayer insulating film 21 is formed using, for example, $SiO_2$ as a material. On the interlayer insulating film 21, an insulating film 22 is formed. (The insulating film 22 is formed using a material, such as SiN, whose permittivity is higher than that of the interlayer insulating film 21.) On the insulating film 22, a metal wiring layer 23 is formed. The metal wiring layer 23 functions as a bit line BL. In the insulating film 22 and interlayer insulating film 21, a contact plug CP3 is formed whose top face makes contact with the metal wiring layer 23 and whose bottom face makes contact with the metal wiring layer 20. The top face of the contact plug CP3 is higher than that of the insulating film 22. That is, the upper part of the contact plug CP3 is formed so as to enter the metal wiring layer 23. On the insulating film 22 and metal wiring layer 23, an interlayer insulating film 24 is formed using a material, such as $SiO_2$, whose permittivity is lower than that of the insulating film 22. The interlayer insulating film 24 fills in the region between adjacent bit lines BL.

Figure 5:
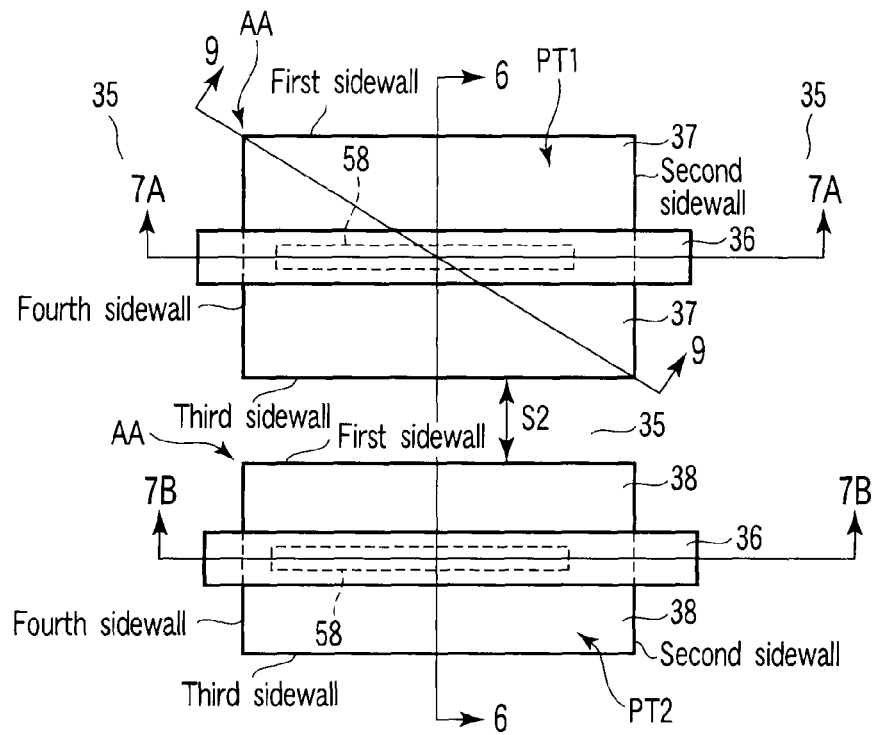
FIG. 5 is a plan view of a peripheral transistor included in the NAND flash memory according to the first embodiment.
Figure 6:
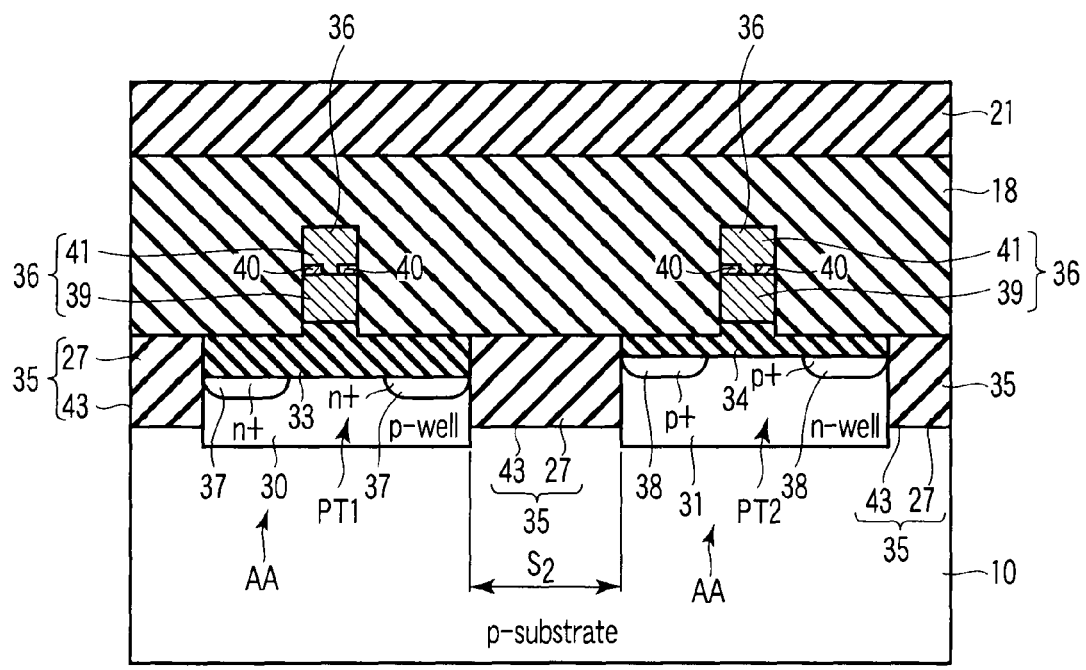
FIG. 6 is a sectional view taken along line 6-6 of FIG. 5.

Next, the configuration of the peripheral transistors PT1, PT2 included in the voltage generator circuit 2, row decoder 3, and column decoder 4 will be explained using FIGS. 5 to 7. FIG. 5 is a plan view of the peripheral transistors PT1, PT2. FIG. 6 is a sectional view taken along line 6-6 of FIG. 5. FIG. 7 is a sectional view taken along line 7A-7A and line 7B-7B of FIG. 5.

As shown in FIG. 5, two active regions AA are formed so as to be sandwiched between element isolating regions 35. Each of the active regions AA has a first to a fourth sidewall, with the first sidewall contacting the second sidewall, the second sidewall contacting the third sidewall, the third sidewall contacting the fourth sidewall, and the fourth sidewall contacting the first sidewall, thereby forming a rectangular shape. A gate electrode 36 is formed which extends to the element isolating region 35 so as to cross the active region AA in a traverse direction. An $n^+$-type impurity diffused layer 37 and a $p^+$-type impurity diffused layer 38 are formed so as to sandwich the gate electrode 36 between them. An opening 58 is made at the intersection of the gate electrode 36 and active region AA. Although in FIG. 5, the gate electrodes are formed only on the sidewalls of the second and fourth sidewalls, there may be a case where the gate electrodes cross the active regions AA vertically and are formed on the first and third sidewalls.

As shown in FIGS. 6 and 7, the adjacent active regions AA are electrically separated by the element isolating region 35. The element isolating region 35 is configured to include a trench 43 made in the p-type semiconductor substrate 10 and an insulating film 27 buried in the trench 43. The width S2 of the element isolating region 35 is set larger than the width S1 of the element isolating region 25 formed in the memory cell array. In the active regions AA electrically separated by the element isolating region 35, a p-well region 30 and an n-well region 31 are formed respectively. On the p-well region 30, a peripheral transistor PT1 is formed. On the n-well region 31, a peripheral transistor PT2 is formed. Active region AA is arranged up and down in FIG. 5, but the active region AA may be arranged in right and left.

First, the peripheral transistor PT1 will be explained. As shown in FIG. 6, on the p-well region 30, a gate insulating film 33 is formed. On the gate insulating film 33, a gate electrode 36 of the peripheral transistor PT1 is formed. The gate electrode 36 has a stacked gate structure which includes a conductive layer 39 formed on the gate insulating film 33 and a conductive layer 41 formed above the conductive layer 39 via an inter-gate insulating film 40. The inter-gate insulating film 40 is removed at an opening 58, with the conductive layers 39, 42 being electrically connected. The p-well region 30 is formed at an impurity concentration of, for example, about $1.0 \times 10^{16}$ to $1.0 \times 10^{19}$ [$cm^{-3}$]. Each of the conductive layers 39 and 41 is formed using a polysilicon single layer film to which any one of phosphorus, arsenic, and boron has been added at a concentration of, for example, $10^{17}$ to $10^{21}$ [$cm^{-3}$] or a stacked-structure film of any one of WSi, NiSi, MoSi, TiSi, and CoSi and the above impurity-added polysilicon. The stack structure has a thickness of about 10 to 800 [nm]. At the surface of the well region 30, an $n^+$-type impurity diffused layer 37 functioning as a source or a drain is formed. The region between the source and drain functions as a channel region acting as an electron moving region. With the above configuration, the peripheral transistor PT1 has been formed.

Next, the peripheral transistor PT2 will be explained. As shown in FIG. 6, on the n-well region 31, a gate insulating film 34 is formed. On the gate insulating film 34, a gate electrode 36 of the peripheral transistor PT2 is formed. The gate electrode 36 of the peripheral transistor PT2, which has the same structure as that of the gate electrode 36 of the peripheral transistor PT1, has a stacked gate structure. At the surface of the well region 31, a $p^+$-type impurity diffused layer 38 functioning as a source or a drain is formed. The region between the source and drain functions as a channel region acting as an electron moving region. With the above configuration, the peripheral transistor PT2 has been formed. The film thickness of the gate insulating film 34 is made less than that of the gate insulating film 33. This is because a higher voltage is applied to the peripheral transistor PT1 than to the peripheral transistor PT2.

Then, on the p-type semiconductor substrate 10, interlayer insulating films 18, 21 are formed so as to cover the peripheral transistors PT1, PT2. In the interlayer insulating films 18, 21, a contact plug (not shown) is formed using a high-melting point metal, such as tungsten or molybdenum, and further a metal wiring layer is formed using, for example, aluminum. A voltage is applied to the peripheral transistors PT1, PT2 via the contact plug and metal wiring layer. The thickness of the interlayer insulating film 21 is about of 10 to 1000 [nm].

Figure 9:
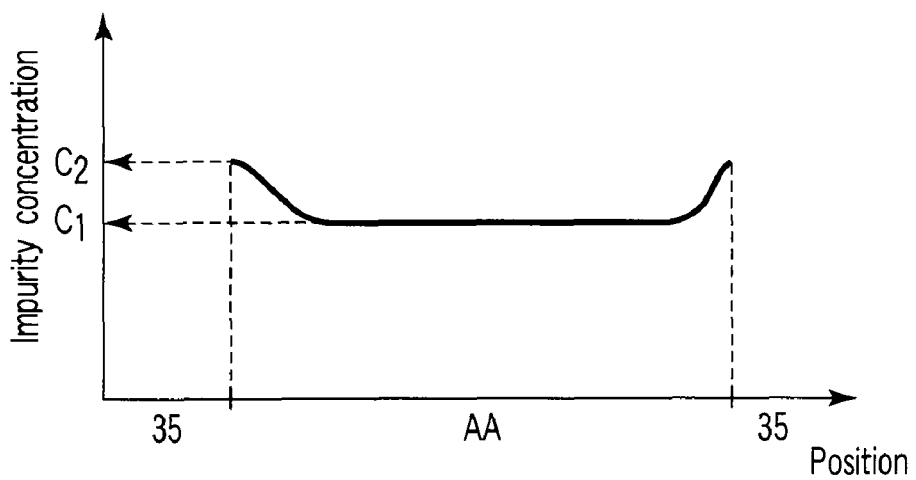
FIG. 9 is a diagram of boron concentration distribution along line 7A-7A and line 7B-7B of FIG. 5.
Figure 10:
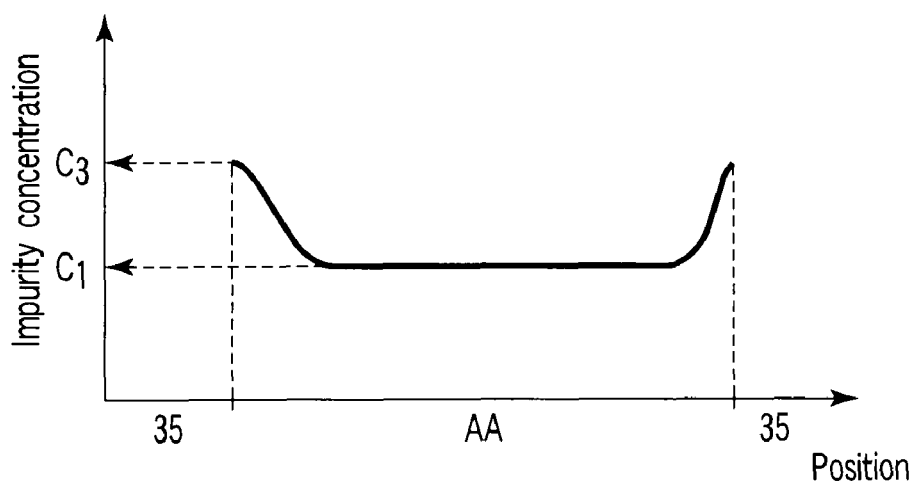
FIG. 10 is a diagram of boron concentration distribution along line 9-9 of FIG. 5.

FIG. 8 is a diagram of the boron concentration distribution along line 4-4 of FIG. 2 in, for example, a sidewall of the active region AA in which memory cell transistors MT are formed. Similarly, FIG. 9 is a diagram of the boron concentration distribution along line 7A-7A and line 7B-7B of FIG. 5 in, for example, a sidewall of the active region in which the peripheral transistors PT1, PT2 are formed. FIG. 10 is a diagram of the boron concentration distribution along line 9-9 of FIG. 5 in, for example, a sidewall of the active region in which the peripheral transistors PT1, PT2 are formed. Here, line 9-9 is a line which extends from the central part of the element region and passes through the side where the second and third sidewalls make contact with each other and the side where the first and fourth sidewalls make contact with each other. In FIGS. 8 to 10, the ordinate axis represents an impurity concentration distribution and the abscissa axis represents, for example, a position in the direction of gate width of the memory cell transistor MT or peripheral transistor PT. The distribution of impurity concentration on the ordinate axis is in a region unaffected by the concentration of the diffused layer and channel, for example, a position in the range of, for example, about 0.1 to 0.5 μm from the surface of the semiconductor substrate 10 and in a position higher than the underside of the element isolating regions 25 and 35. For the sake of convenience, the impurity concentration distribution in the element isolating regions 23, 35 is omitted.

In FIG. 8, the impurity concentration in the center of the active region AA is almost the same as that in the side faces of the active region AA. In FIG. 9, the impurity concentration (C2 in the figure) in the side face of the second and fourth sidewalls is higher than the impurity concentration (C1 in the figure) in the center of the active region AA. Specifically, the impurity concentration in the region contacting the side face of the element isolating region 35 in the active region AA formed in the semiconductor substrate 10 is higher than the impurity concentration in the center of the active region AA. Similarly, in FIG. 10, The impurity concentration (C3 in the figure) in the region where the first sidewall and the fourth sidewall make contact with each other and in the region where the second sidewall and the third sidewall make contact with each other, is higher than the impurity concentration (C1 in the figure) in the center of the active region AA. In FIGS. 9 and 10, the comparison of impurity concentrations on the ordinate axis has shown the following relationship:

$$C1<C2<C3.$$

Figure 15:
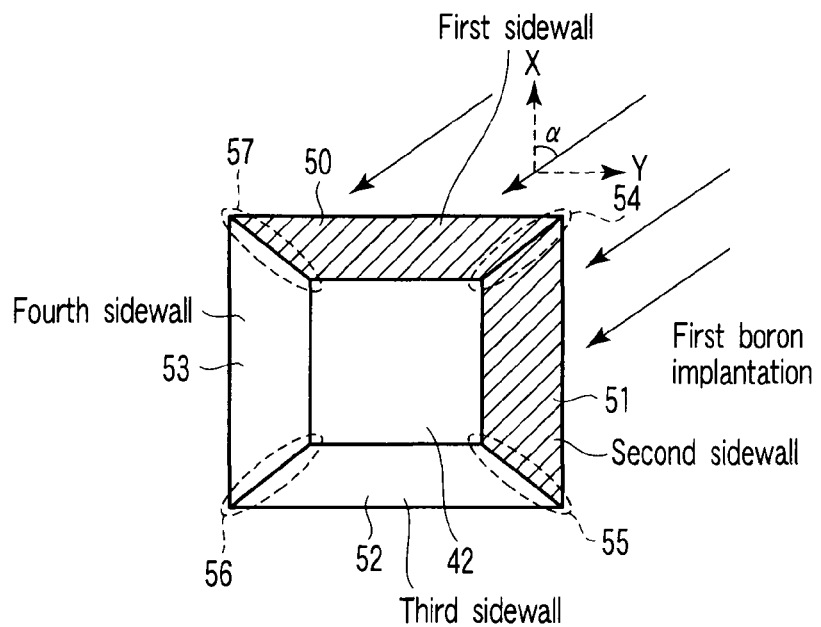
FIG. 15 is a top view of the peripheral transistor shown in the manufacturing step in either FIG. 12A or 12B of the semiconductor device according to the first embodiment, showing a state where implantation has been performed at an angle of α=45 degrees.
Figure 16:
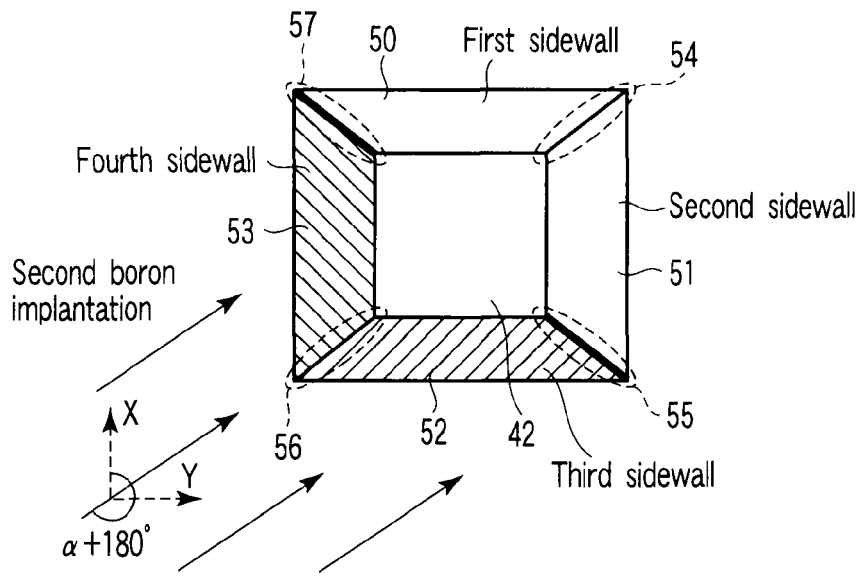
FIG. 16 is a top view of the peripheral transistor shown in the manufacturing step in either FIG. 12A or 12B of the semiconductor device according to the first embodiment, showing a state where implantation has been performed at an angle of α=225 degrees.

Next, a method of manufacturing the memory cell transistors MT and peripheral transistors PT1, PT2 will be explained using FIGS. 11A to 11C, FIGS. 12A to 12C, FIGS. 13 to 16, FIGS. 17A to 17C, and FIGS. 18A to 18C. FIGS. 11A to 11C, FIGS. 12A to 12C, FIGS. 17A to 17C, and FIGS. 18A to 18C are sectional views to help explain the steps of manufacturing memory cell transistors MT and peripheral transistors PT1, PT2. FIGS. 11A, 12A, 17A, and 18A show a sectional configuration of a high-voltage peripheral transistor PT1 in the direction of gate width. FIGS. 11B, 12B, 17B, and 18B show a sectional configuration of a low-voltage peripheral transistor PT2 in the direction of gate width. FIGS. 11C, 12C, 17C, and 18C show a sectional configuration of a memory cell transistor MT in the direction of gate width. FIG. 13 is a perspective view of the memory cell transistor MT in the step of FIG. 12. FIG. 14 is a perspective view of the peripheral transistors PT1, PT2 in the step of FIG. 12. FIG. 15 and FIG. 16 is a top view of either the peripheral transistor PT1 or PT2 in the step of FIG. 12.

Figure 11A:
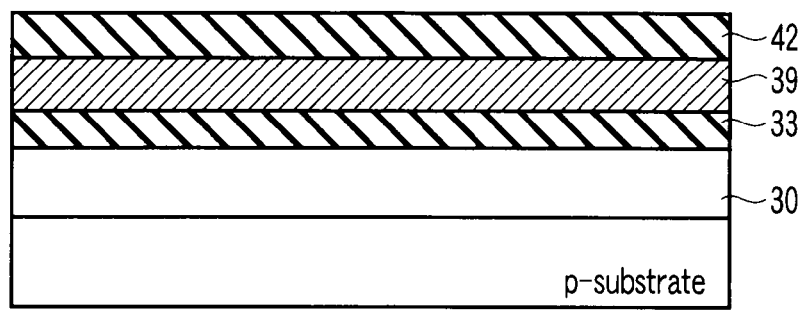
FIGS. 11A to 11C are sectional views to help explain a first manufacturing step of a semiconductor device according to the first embodiment, FIGS. 11A and 11B being sectional views of a peripheral transistor taken along the gate width and FIG. 11C being a sectional view of a memory cell transistor taken along line 4-4 of FIG. 2.
Figure 11B:
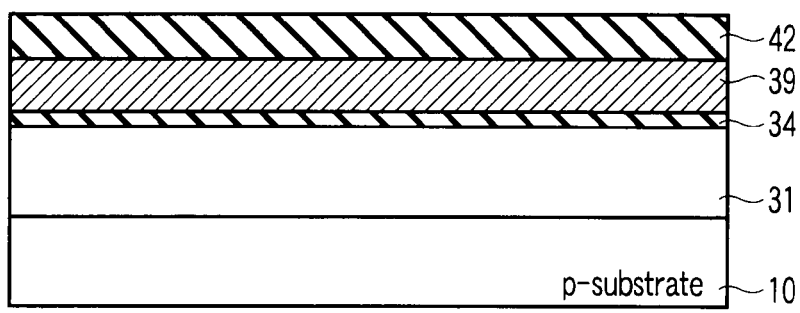
Figure 11C:
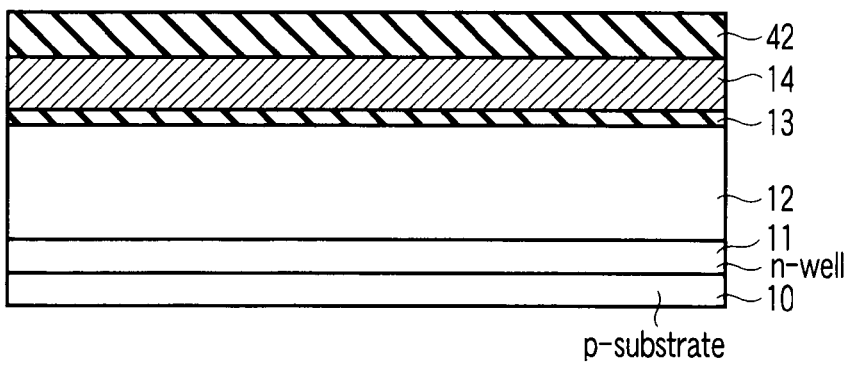

As shown in FIGS. 11A to 11C, an n-well region 11 is formed at the surface of a p-type semiconductor substrate 10 in a memory cell transistor MT forming region. At the surface of the well region 11, a p-well well region 12 is formed. To adjust the transistor characteristics, a p-well region 30 and an n-well region 31 are formed at the surface of the semiconductor substrate 10 in a peripheral transistor PT1 forming region and a peripheral transistor PT2 forming region, respectively. The p-well region 30 and n-well region 31 may be omitted.

Then, on the well region 12, a gate insulating film 13 is formed. On the well regions 30, 31, a gate insulating film 33 and a gate insulating film 34 are formed respectively. As described above, the gate insulating film 33 is formed so as to be thicker than the gate insulating film 34. Moreover, on the gate insulating film 13, a conductive layer 14 and an insulating film 42 are formed sequentially. On the gate insulating films 33, 34, a conductive layer 39 and an insulating film 42 are formed sequentially. The conductive layers 14, 39 may be formed using the same material at the same time. This holds true for the insulating film 42.

Figure 12A:
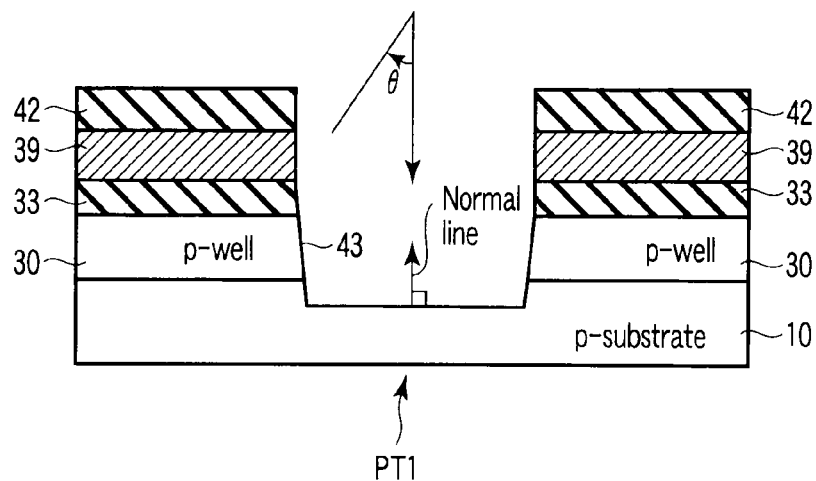
FIGS. 12A to 12C are sectional views to help explain a second manufacturing step of the semiconductor device according to the first embodiment, FIGS. 12A and 12B being sectional views of the peripheral transistor taken along the gate width and FIG. 12C being a sectional view of the memory cell transistor taken along line 4-4 of FIG. 2.
Figure 12B:
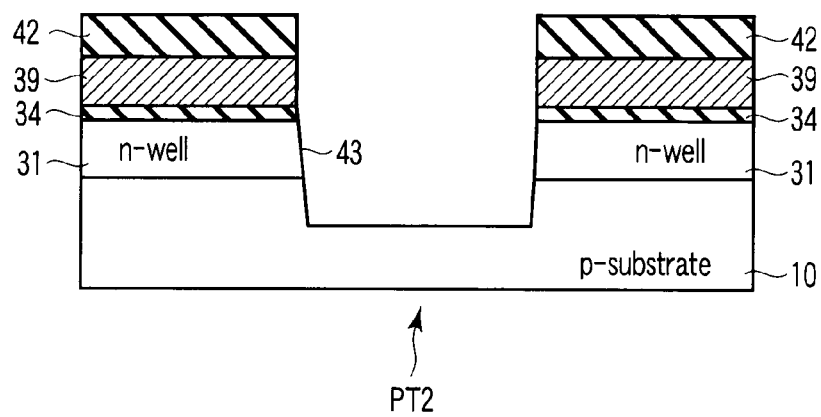
Figure 12C:
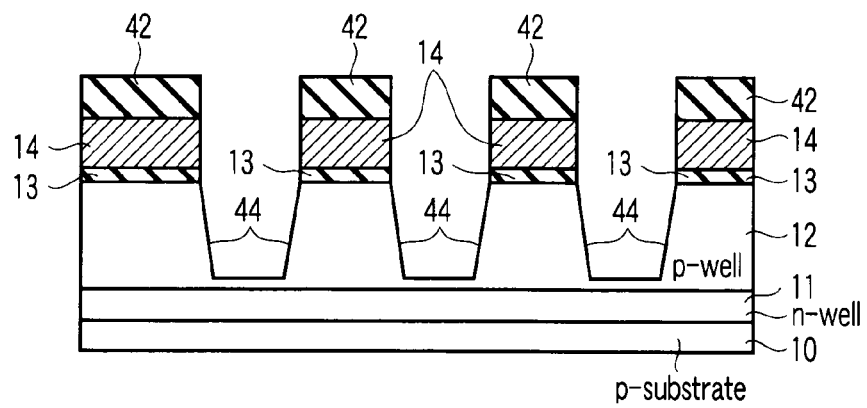
Figure 13:
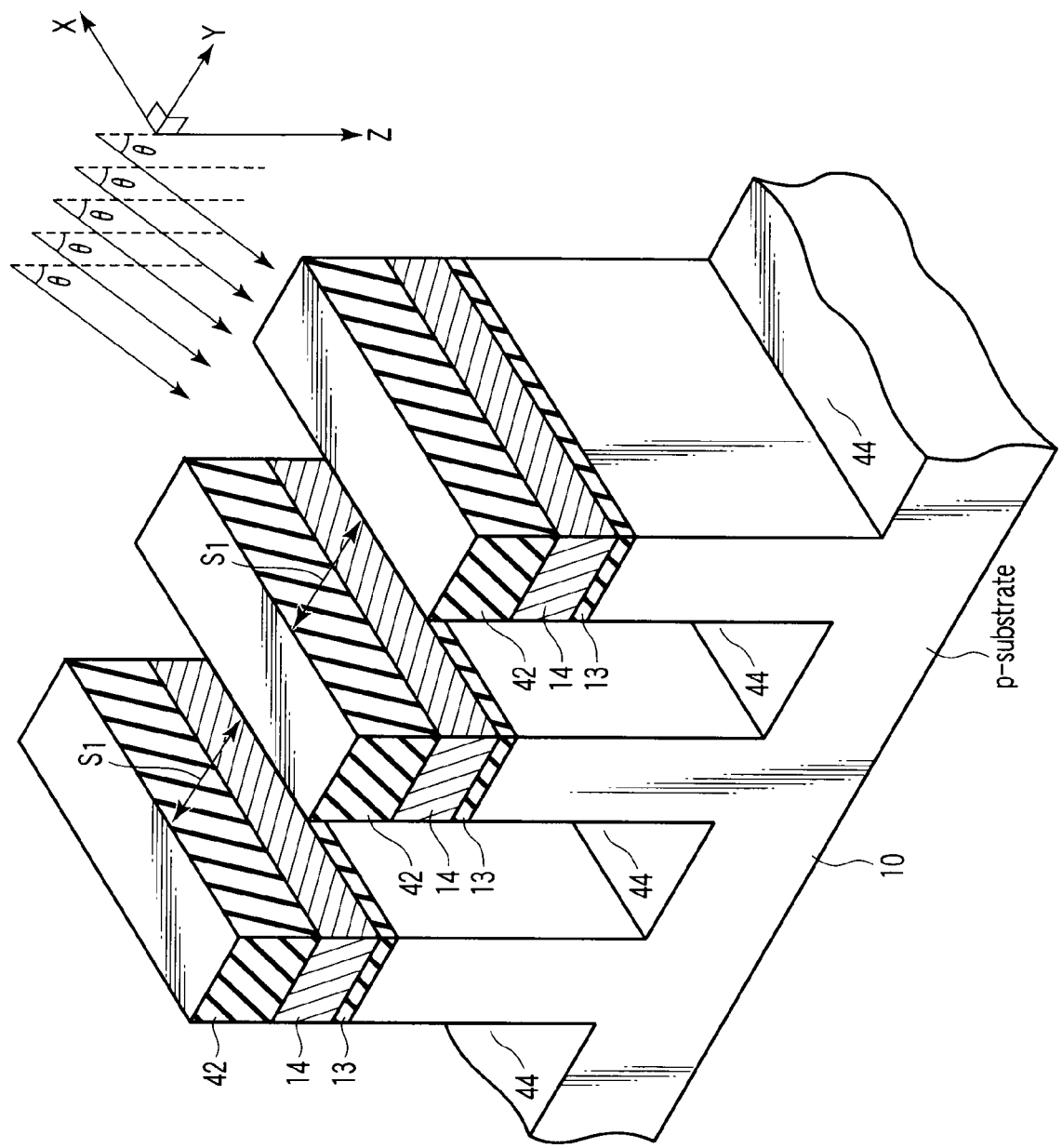
FIG. 13 is a perspective view of the memory cell transistor shown in the manufacturing step in FIG. 12C of the semiconductor device according to the first embodiment.

As shown in FIGS. 12A to 12C, trenches for forming element isolating regions are made in the memory cell transistor MT forming region and the peripheral transistor PT1 forming region and peripheral transistor PT2 forming region. Specifically, the insulating film 42 is patterned after the formation pattern of the element isolating regions 25, 35 using photolithographic techniques. Thereafter, with the insulating film 42 as a mask, the conductive layers 14, 39, gate insulating films 13, 33, 34, and p-type semiconductor substrate 10 are etched by anisotropic etching (RIE). As a result, in each of the memory cell transistor MT forming region, peripheral transistor PT1 forming region, and peripheral transistor PT2 forming region, trenches 43, 44 whose bottom is located in the semiconductor substrate 10 are made from the surface of the insulating film 42.

Next, impurities (e.g., group-III element impurities, boron, boron fluoride, and boron difluoride) are ion-implanted into the semiconductor substrate 10 (active region AA) exposed to the side face of the trench 43. In this case, ions are implanted into the entire surface of the memory cell transistor MT, peripheral transistor PT1 forming region, and peripheral transistor PT2 forming region in an oblique direction with respect to a normal line to the surface of the semiconductor substrate 10. Hereinafter, let the angle to the normal line be a tilt angle θ. Moreover, ions are implanted in an oblique direction with respect to a normal line to the semiconductor substrate 10 exposed to the side face of the trenches 43, 44. Hereinafter, the angle is referred to as a twist angle α. In the first embodiment, ions are implanted twice. Different twist angles α are used in two ion-implantations. The tilt angle θ may be the same or different.

Hereinafter, the ion implanting steps will be explained in detail using FIGS. 13 to 16. FIGS. 13 and 14 are perspective views of a memory cell transistor MT forming region and a forming region for peripheral transistors PT1, PT2 at the time of ion implantation, respectively. FIGS. 15 and 16 are top views of the peripheral transistors PT1, PT2 at the time of a first and a second ion implantation, respectively.

As shown in FIG. 13, in the memory cell transistor MT forming region, a direction in which an active region AA extends is called the x-axis, a direction perpendicular to the x-axis is called the y-axis, and a direction perpendicular to both the x-axis and the y-axis is called the z-axis. Accordingly, the direction of a normal line to the surface of the semiconductor substrate 10 is in a direction along the z-axis.

In the peripheral transistors PT1, PT2 forming region shown in FIG. 14, an active region AA has a first to a fourth sidewall as explained in FIG. 5. A direction normal to the side face of the second sidewall is called the y-axis, a direction perpendicular to the x-axis is called the x-axis, and the direction perpendicular to both the x-axis and y-axis is called the z-axis. Suppose the x-y plane is a plane parallel with the main plane of the semiconductor substrate surface and the z-axis coincides with the direction of the normal line to the surface of the semiconductor substrate 10. Accordingly, in the memory cell array, the side faces of the active regions AA are exposed at intervals of S1 in the y direction. In the peripheral transistors PT1, PT2, the second and fourth sidewalls of the peripheral transistors PT1, PT2 are exposed in the y direction, and the first and third sidewalls are exposed at intervals of S2 in the x direction.

As shown in FIGS. 13 to 16, ions are implanted using a certain tilt angle θ and twist angle α. The ions used are acceptor ions. For example, group-III boron ions are used. The ion dose amount is in the range from $10^{11}$ [ion/cm$^2$] to $10^{13}$ [ion/cm$^2$]. In this case, the tilt angle θ satisfies the following expression:

$$\theta \geq \tan^{-1}(S1/H)$$

where S1 is the width of the trench 43 as described above and H is the height from the interface between the gate insulating film 13 and p-type semiconductor substrate 10 to the surface of the insulating film 42. For example, the width S1 is set in the range of 10 nm to 100 nm. H is set to a value (60 nm to 600 nm) about six times as large as S1. Therefore, in this case, the tilt angle θ is 10 degrees.

Furthermore, the twist angle α is set to 45° in a first ion implantation and 225° in a second ion implantation with a normal line to the side face of the first sidewall as a reference as shown in FIGS. 15 and 16. In FIG. 15, the regions into which ions are implanted in the first ion implantation are shaded. In FIG. 16, the regions into which ions are implanted in the second ion implantation are shaded.

As shown in FIGS. 15 and 16, in the first ion implantation, ions are implanted into the first sidewall and the second sidewall making contact with the first sidewall among the first to fourth sidewalls. That is, ions are implanted into a first side part 50 (or a first side face 50) and a second side part 51 (or a second side face 51). In the second ion implantation, ions are implanted into the third sidewall and the fourth sidewall making contact with the third sidewall among the first to fourth sidewalls. That is, ions are implanted into a third side part 52 (or a third side face 52) and a fourth side part 53 (or a fourth side face 53). The angle used as the twist angle α is not limited to 45 degrees or 225 degrees and may be any angle that enables ions to be implanted simultaneously into two sidewalls in contact with each other. If the twist angle α in the first ion implantation is α1 and the twist angle α in the second ion implantation is α2, α1 has to be about 40 to 50 degrees and α2 has to be (α1+180) degrees.

After the boron ion implantation, the insulating films 26, 27 are buried in the trenches 44 and 43 adjacent to the memory cell transistor MT and peripheral transistors PT1, PT2, thereby forming the element isolating regions 25 and 35, as shown in FIGS. 17A to 17C.

Figure 18A:
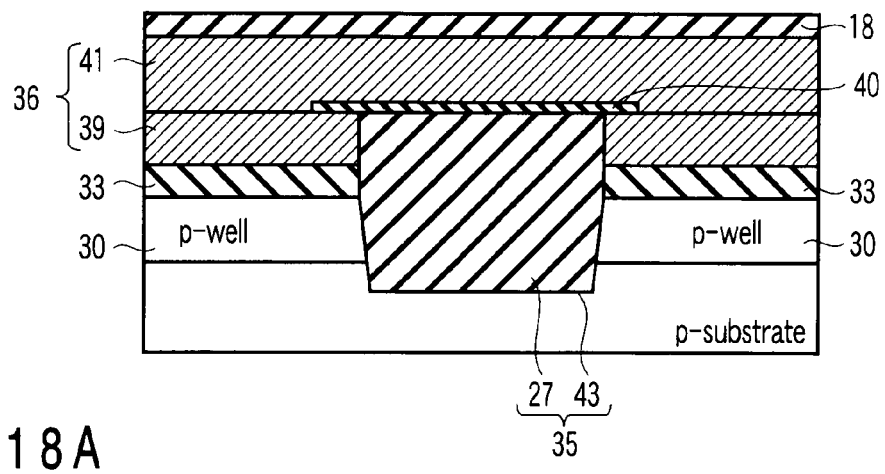
FIGS. 18A to 18C are sectional views to help explain a fourth manufacturing step of the semiconductor device according to the first embodiment, FIGS. 18A and 18B being sectional views of the peripheral transistor taken along the gate width and FIG. 18C being a sectional view of the memory cell transistor taken along line 4-4 of FIG. 2.
Figure 18B:
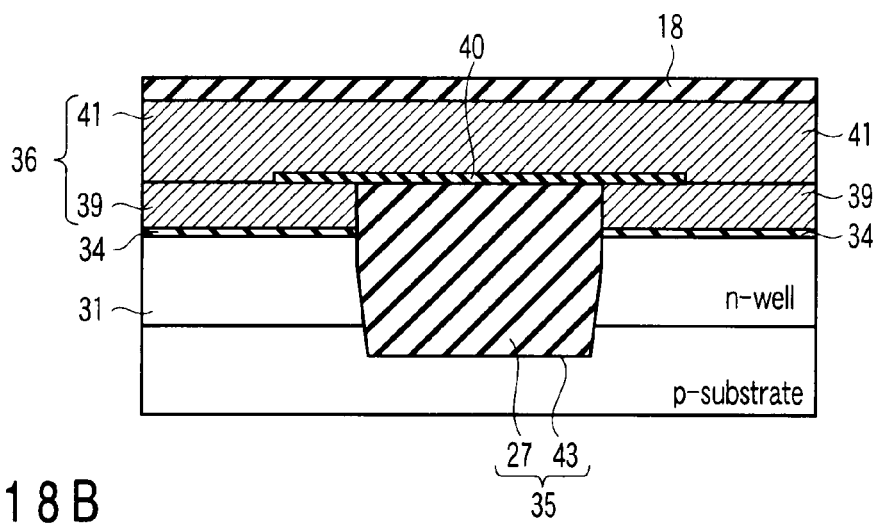
Figure 18C:
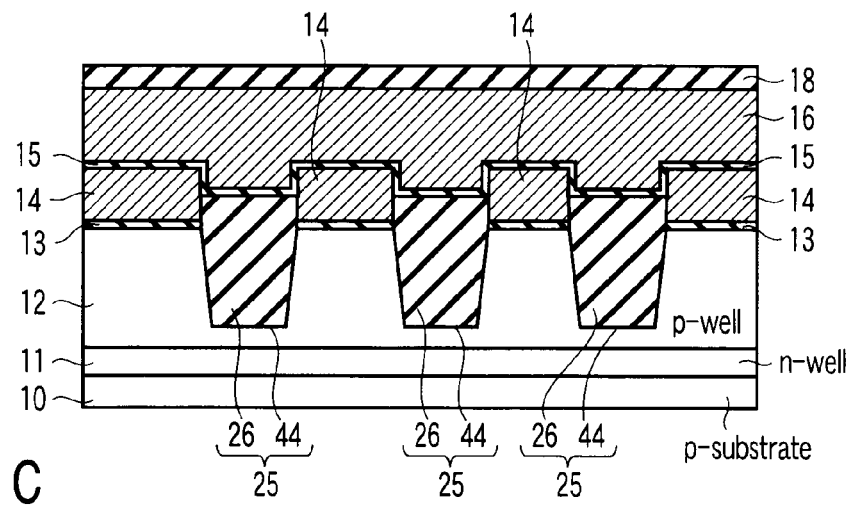

In the memory cell transistor MT forming region, the top face of the element isolating region 25 is made lower and the insulating film 42 is removed by etching. Thereafter, as shown in FIGS. 18A to 18C, insulating films 40 and 15 are formed on the top faces of the conductive layers 39 and 14. Moreover, conductive layers 41 and 16 are formed on the insulating films 40 and 15. Thereafter, the conductive layers 39 and 41 and the conductive layers 14, 16 and insulating film 15 are patterned, thereby forming the gate electrodes of the memory cell transistor MT and peripheral transistors PT1, PT2. Then, an interlayer insulating film 18 is formed on the conductive layers 41 and 16. Thereafter, on the interlayer insulating film 18, an interlayer insulating film 21, an insulating film 22, a metal wiring layer 23, and an interlayer insulating film 24 are formed, thereby producing a memory cell transistor MT and peripheral transistors PT1, PT2 shown in FIGS. 3, 4, 6 and 7.

As described above, the semiconductor memory device and the semiconductor memory device manufacturing method according to the first embodiment produce the effects described below.

(1) The operational reliability can be improved.

This effect will be explained in detail by comparing a conventional semiconductor memory device and its manufacturing method with those of the first embodiment.

First, in the process of manufacturing a semiconductor memory device, a trench 43 for an element isolating region 35 is made by RIE techniques. The element isolating region 35 is for separating peripheral transistors PT electrically. At this time, in a conventional semiconductor memory device, the following phenomenon was observed: the side face of the trench 43, that is, the side face of an exposed active region AA in which the peripheral transistors PT were to be arranged, was damaged and the vicinity of the interface at the side face charged positively.

Moreover, in the semiconductor memory device manufacturing process particularly according to the first embodiment, the space between not only the memory cell transistors MT but also their nearby peripheral transistors PT has reached the order of several micrometers. That is, as semiconductor memory devices have been miniaturized further, the effect of a positive charge accumulated near the interface at the side face cannot be ignored anymore and a malfunction has occurred particularly in a high-voltage peripheral transistor PT1 with an n-channel.

The malfunction will be explained in detail using FIG. 19, which shows an I-V characteristic of a high-voltage peripheral transistor PT1 in a Log representation. Specifically, (a) in FIG. 19 represents an I-V characteristic showing the effect of positive charge accumulated at the interface region at a trench made in a conventional RIE step, that is, the side face of the active region AA, on the high-voltage peripheral transistor PT1. Moreover, (b) in FIG. 19 shows an I-V characteristic of the high-voltage peripheral transistor of the first embodiment.

As shown in an encircled region of FIG. 19, in the electrical characteristic of a conventional transistor, the value of current has reached a saturated region, while drawing a stepwise line with respect to a voltage applied to the gate electrode. That is, the current increases to the value of a certain voltage, keeping a specific inclination. Then, after the current has kept the specific value, or after the inclination of the current has decreased for a specific period, the current increases again as the voltage rises and finally gets saturated. This phenomenon is known as a kink. The reason why a kink occurs is as follows.

In the conventional semiconductor memory device explained above, a positive charge accumulates in the interface region of the side face 43 of the peripheral transistor PT. As a result, when a voltage is applied to the gate electrode, the accumulated positive charge causes a channel to be formed at the side face (e.g., the part where the second and fourth sidewalls of FIG. 5 make contact with the gate electrode) of the active region AA under the gate electrode, allowing current to flow between the source and drain earlier than in the central part of the gate electrode (e.g., the part through which line 6-6 passes in FIG. 5). That is, the accumulated positive charge caused a leakage current, turning on the transistor. Because of this effect, a kink occurred in the conventional semiconductor memory device, causing a malfunction.

To overcome this problem, for example, group-III boron ions are implanted into the side face of the active region AA in the semiconductor memory device and its manufacturing method according to the first embodiment. This causes a positive charge generated in the interface region at the side face of the active region AA to be cancelled electrically. That is, when a voltage is applied to the high-voltage peripheral transistor PT1, a channel is formed at almost the same voltage, for example, in the central part of the gate electrode and at the side face of the active region AA under the gate electrode shown in FIG. 5, which enables a kink to be prevented from occurring.

Accordingly, the high-voltage peripheral transistor PT of the first embodiment presents an I-V characteristic shown by (b) in FIG. 19, which prevents a kink from occurring. That is, the drain current gets saturated at a specific current value with respect to the gate voltage.

Normally, four ion implantations are needed because boron ions have to be implanted into each of the first to fourth sidewalls. As shown in FIGS. 15 and 16, in the first embodiment, however, boron ions have only to be implanted at a twist angle α of 45 degrees once and at a twist angle α of 225 degrees once. That is, the number of ion implantations can be reduced.

Furthermore, boron ions are implanted at least once into a corner part 54 where the first side part 50 and second side part 51 make contact with each other and into a corner part 56 where the third side part 52 and fourth side part 53 make contact with each other. In contrast, boron ions are implanted at least twice into a corner part 57 where the first side part 50 of the first sidewall and the fourth side part 53 of the fourth sidewall make contact with each other and into a corner part 55 where the second side part 51 of the second sidewall and the third side part 52 of the third sidewall make contact with each other. That is, the boron ion concentration in the corner parts 55 and 57 is higher than that at the corner parts 54 and 56.

Here, although the boron ion concentration in the corner parts 55 and 57 differs from that in the corner parts 54 and 56, there is no effect on the characteristics of the high-voltage peripheral transistor PT1. This is because no channel is formed at the corner parts 55 to 57 and the source-drain resistance is unaffected in consideration of the current path.

(2) The number of manufacturing steps can be decreased.

Determining an implantation angle θ (tilt angle) to the side face of an active region AA according to the first embodiment prevents boron ions from being implanted into the side face of an active region AA in which a memory cell transistor MT is arranged. In contrast, boron ions can be implanted only into the side face of an active region AA in which peripheral transistors PT are arranged.

Specifically, if an angle at which boron ions are implanted is not taken into consideration in the manufacturing steps of FIG. 12 explained above, boron ions will be implanted not only into the side face of the active region AA in which peripheral transistors PT are arranged but also into the side face of the active region AA in which a memory cell transistor MT is arranged. As a result, the amount of impurity implanted into the channel of a boron-ion-added memory cell transistor has to be adjusted again, which causes the problem of increasing the manufacturing steps. In addition, the memory cell transistors MT are written into erroneously, or the tolerability of the memory cell transistor MT deteriorates. That is, there is a risk of affecting the operational reliability of the memory cell transistor MT. For this reason, a mask material had to be applied in advance and lithographic processing had to be performed beforehand. That is, the conventional semiconductor memory device needs the steps of applying a photoresist to the entire surface and then making an opening in the photoresist only in a region into which boron ions are implanted.

In the first embodiment, however, boron ions are implanted only into the side face of the active region AA in which the peripheral transistors PT1, PT2 serving as a target are arranged, which saves the trouble of increasing the number of manufacturing steps, such as the application of a mask material in the memory cell transistor MT forming region or lithographic processing. In the first embodiment, to obtain this effect, the width S2 of the element isolating region 35 in the peripheral transistors PT1, PT2 regions is made greater than the width S1 of the element isolating region 25 in the memory cell transistor MT region. Moreover, a boron ion implantation angle θ has been taken into account. That is, the value the θ can take at which boron ions are not implanted into the semiconductor substrate exposed in the trench 44 in the memory cell transistor MT forming region 44 is calculated and ion implantation is performed under the condition that $\theta \geq \tan^{-1}(S1/H)$. As a result, boron ions are prevented from being implanted into the p-type semiconductor substrate 10 exposed in the trench 44 in the memory cell transistor MT forming region, that is, into the side face of the active region AA. Boron ions are implanted into the p-type semiconductor substrate 10 exposed in the trench 43 in the peripheral transistor PT forming region, that is, into the side face of the active region AA.

This makes it possible to add boron ions only to the side face of the active region AA in which peripheral transistors PT are arranged, without applying a mask material or performing lithographic processing.

Second Embodiment

Next, a semiconductor memory device and a method of manufacturing the semiconductor memory device according to a second embodiment of the invention will be explained. The second embodiment is such that the number of ion implantations and the rotation angle α are changed in the manufacturing steps in FIGS. 12A to 12C of the first embodiment.

In the second embodiment, the rotation angle α of boron implantation in two directions shown in FIGS. 15 and 16 in the peripheral transistors PT1 and PT2 is set to α, (α+90) degrees, (α+180) degrees, and (α+270) degrees with a normal line to the side face of the first sidewall and ions are implanted in four directions. That is, if the twist angle α in a first ion implantation is α1, it follows that α2=(α+90) degrees, α3=(α+180) degrees, and α4=(α+270) degrees.

Hereinafter, the way ions are implanted will be explained using FIGS. 20 to 23. FIGS. 20 to 23 are top views of a peripheral transistor PT.

Figure 21:
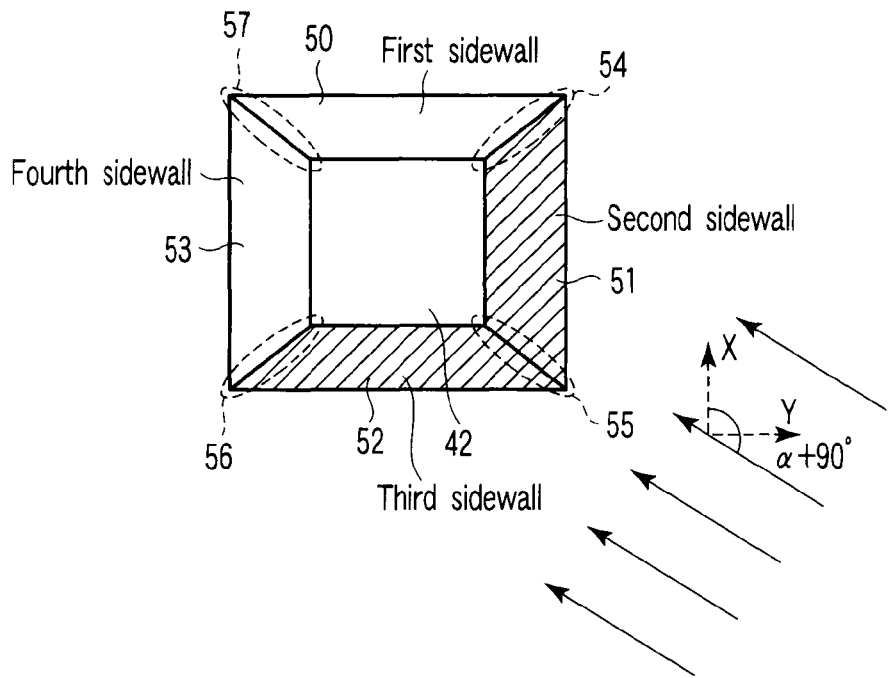
FIG. 21 is a top view of the peripheral transistor shown in the manufacturing step in either FIG. 12A or 12B of the semiconductor device according to the second embodiment, showing a state where implantation has been performed at an angle of α=135 degrees.
Figure 22:
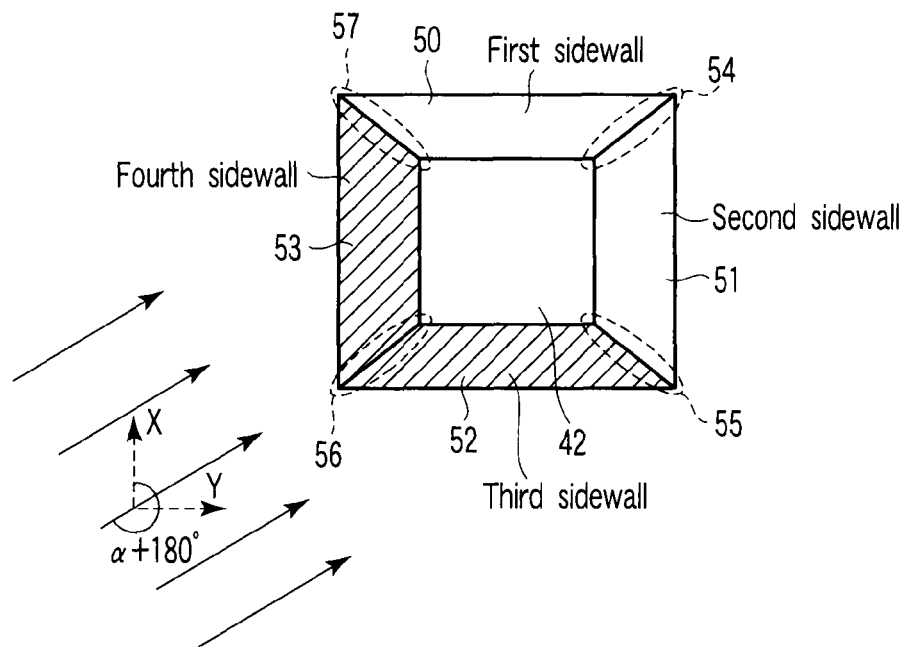
FIG. 22 is a top view of the peripheral transistor shown in the manufacturing step in either FIG. 12A or 12B of the semiconductor device according to the second embodiment, showing a state where implantation has been performed at an angle of α=225 degrees.
Figure 25:
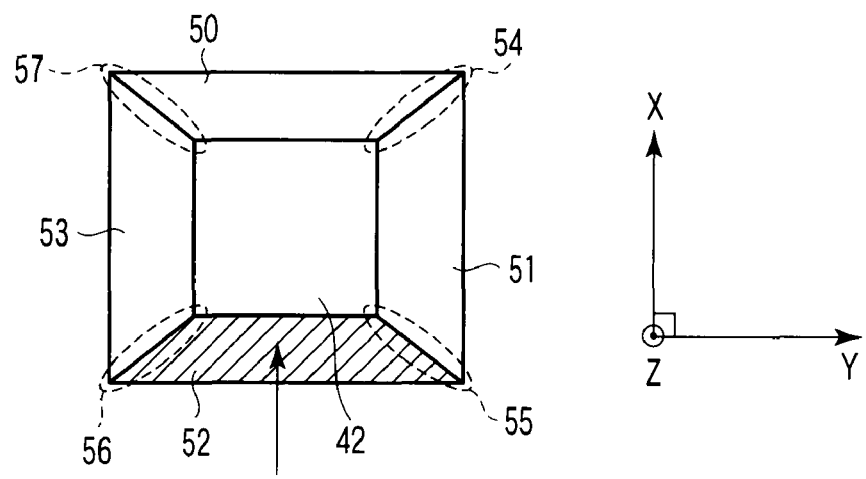
FIG. 25 is a top view of the peripheral transistor shown in the manufacturing step in either FIG. 12A or 12B of the semiconductor device according to the second embodiment, showing a state where implantation has been performed at an angle of α=90 degrees.
Figure 26:
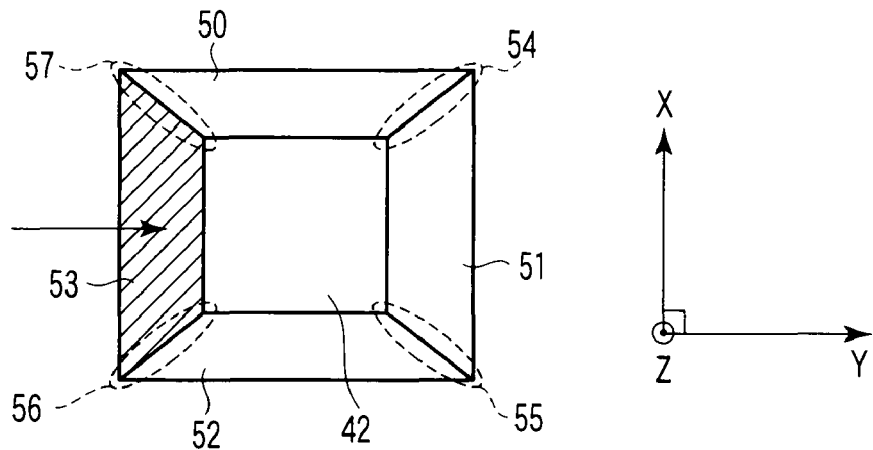
FIG. 26 is a top view of the peripheral transistor shown in the manufacturing step in either FIG. 12A or 12B of the semiconductor device according to the second embodiment, showing a state where implantation has been performed at an angle of α=180 degrees.
Figure 27:
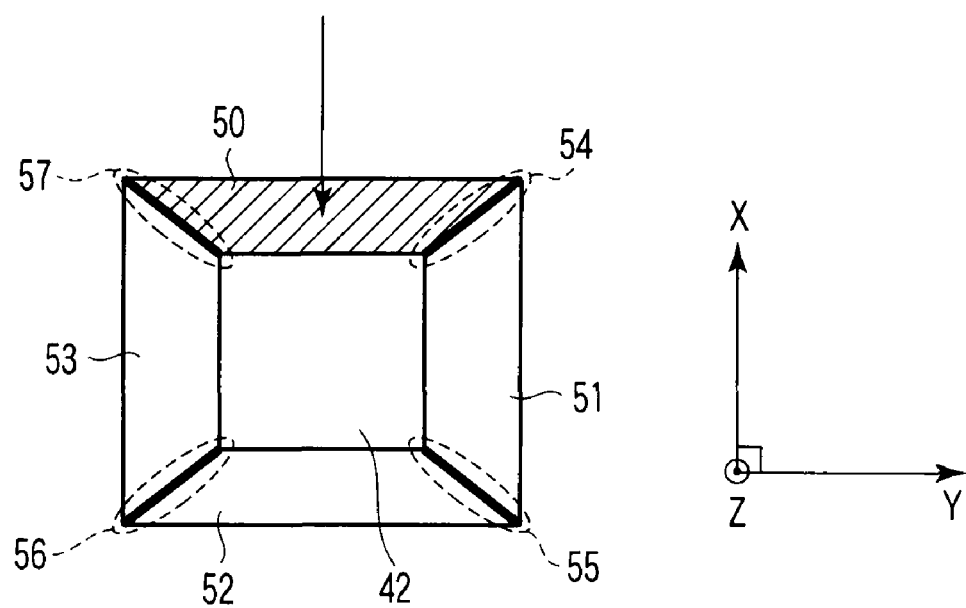
FIG. 27 is a top view of the peripheral transistor shown in the manufacturing step in either FIG. 12A or 12B of the semiconductor device according to the second embodiment, showing a state where implantation has been performed at an angle of α=270 degrees.

First, as shown in FIG. 20, with the value of the twist angle α1 being set to 45 degrees, ions are implanted. As a result, of the first to fourth sidewalls, ions are implanted into the first sidewall and the second sidewall in contact with the first sidewall. That is, ions are implanted into the first side part 50 and second side part 51 of the active region AA. As shown in FIG. 21, with the value of the twist angle α2 being set to 135 degrees, ions are implanted. As a result, of the first to fourth sidewalls, ions are implanted into the second sidewall and the third sidewall in contact with the second sidewall. That is, ions are implanted into the second side part 51 and third side part 52 of the active region AA. As shown in FIG. 22, with the value of the twist angle α3 being set to 225 degrees, ions are implanted. As a result, of the first to fourth sidewalls, ions are implanted into the third sidewall and the fourth sidewall in contact with the third sidewall. That is, ions are implanted into the third side part 52 and fourth side part 53 of the active region AA.

As shown in FIG. 23, with the value of the twist angle α4 being set to 315 degrees, ions are implanted. As a result, of the first to fourth sidewalls, ions are implanted into the fourth sidewall and the first sidewall in contact with the fourth sidewall. That is, ions are implanted into the fourth side part 53 and first side part 50 of the active region AA. Accordingly, the ion concentration of boron added to the corner parts 54 to 57 shared by the first side part 50 to fourth side part 53 is higher than the ion concentration of boron added to the first side part 50 to fourth side part 53.

The semiconductor memory device according to the second embodiment produces not only the effects described in item (1) and item (2) but also the following effect.

(3) A drop in the junction breakdown voltage to the p-type semiconductor substrate can be prevented.

This effect will be explained in detail in comparison with a conventional semiconductor memory device.

In the conventional semiconductor memory device, boron ions are implanted vertically into the side faces 51 to 53 of an active region AA in a peripheral transistor PT shown in FIGS. 24 to 27. That is, the rotation of twist angle α at which boron ions are implanted is set to α, (α+90) degrees, (α+180) degrees, and (α+270) degrees.

Specifically, after boron ions are implanted at each of the rotation of twist angles once, the boron ion concentration in the corner parts 54 to 57 shared by any two of the side faces is higher than the boron ion concentration in the first side part 50 to fourth side part 53 shown in FIGS. 24 to 27. This is because ions are implanted once into the first side part 50 to fourth side part 53, whereas boron ions are implanted twice into the corner parts 54 to 57. Therefore, the junction breakdown voltage to the semiconductor substrate drops at the corner parts 54 to 57 as compared with the first side part 50 to fourth side part 53.

In this respect, in the second embodiment, boron ions are implanted, with the rotation of twist angle α being shifted at intervals of 90 degrees and twist angle α is 45 degrees. Accordingly, since boron ions are implanted twice into each of the first side part 50 to fourth side part 53, the concentrations in the first side part 50 to fourth side part 53 and their corner parts 54 to 57 are higher than those in a conventional equivalent.

That is, the boron ion concentration in the first side part 50 to fourth side part 53 and that in their corner parts 54 to 57 can be made almost uniform. Therefore, a drop in the junction breakdown voltage of the corner parts 54 to 57 to the semiconductor substrate can be prevented more than in the conventional equivalent.

In the first embodiment, the value of the critical angle θ at which boron ions are implanted is 10 degrees. However, the value of θ is not particularly limited, provided that the value is 10 degrees or more. However, it is desirable that the maximum value of θ should be about 60 degrees. In the second embodiment, as the dimensions of each transistor change, the range of the tilt angle θ changes. That is, the tilt angle θ is not restricted to that in the second embodiment.

In the second embodiment, the shape of the active region AA is not limited to a complete square. Of course, the corner part of the active region AA may be rounded by, for example, etching or oxidation. Moreover, the shape of the active region AA further includes a parallelogram, a rhombus, and a trapezium.

In the manufacturing steps of the first embodiment of FIGS. 12A to 12C, boron ions are implanted at an energy higher than a certain level into the side face of the active region AA in which the peripheral transistors PT1, PT2 are arranged. Therefore, the semiconductor substrate is damaged to no small extent. To overcome this problem, an insulating film, such as a silicon dioxide film, may be formed on the side face before boron implantation. Since the insulating film formed on the side face has a film thickness of the order of nanometers, when boron ions are implanted, they can pass through the insulating film protecting the semiconductor substrate. That is, boron ions pass through the insulating film and combine with the positive charge accumulated at the side interface, which enables the ions and charge to be cancelled with one another electrically.

The NAND flash memory cell of the second embodiment is a so-called FG-type memory cell transistor which has a stacked gate structure that includes a charge storage layer (e.g., a floating gate) formed above a p-type semiconductor substrate via a gate insulating film and a control gate electrode formed above the floating gate via an inter-gate insulating film. The NAND flash memory cell may have a MONOS structure which includes a charge storage layer (e.g., an insulting film) formed above a semiconductor substrate via a gate insulating film, an insulating film (hereinafter, referred to as a block layer) which is formed on the insulating film and whose permittivity is higher than that of the charge storage layer, and a control gate electrode further formed on the block layer.

While in the first embodiment, the value of the twist angle θ is set to 45 degrees and 225 degrees, it may be set to 135 degrees and 225 degrees. In the first embodiment, two boron ion implantations are performed at the twist angles α=45° and 255. In the second embodiment, boron ions are implanted at the twist angles α=45°, 135°, 225°, and 315°. The rotation angle from α1 is allowed to have an error of about (180±5) degrees. A second twist angle α2 is expressed as (α1+180) degrees.

In the second embodiment, when a first implantation twist angle is α1, a second to a fourth implantation angle are (α1+90) degrees, (α1+180) degrees, and (α1+270) degrees. The rotation angle from α1 is allowed to have an error of about (90±5) degrees, (180±5) degrees, and (270±5) degrees. If group-III ion species are used, aluminum or gallium may be used as an impurity implanting material.

Furthermore, in the first and second embodiments, it is conceivable that the vicinity of the interface at the side face of the active region AA in which peripheral transistors PT are to be arranged is negatively charged. In this case, the side face of the active region AA is doped with n-type impurities, such as phosphorus or arsenic.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device manufacturing method comprising:
    forming a first gate insulating film and a second gate insulating film on a first region in which a memory cell transistor is to be formed and on a second region in which a peripheral transistor for controlling the memory cell transistor is to be formed on a semiconductor substrate, respectively;
    forming a first conductive layer on each of the first gate insulating film and second gate insulating film;
    forming a mask material on the first conductive layer;
    making a first trench which passes through the mask material, first conductive layer, and first gate insulating film in the first region and reaches the inside of the semiconductor substrate and a second trench which passes through the mask material, first conductive layer, and second gate insulating film in the second region and has a bottom face that reaches the inside of the semiconductor substrate and a side face in contact with the bottom face and which has a greater width than that of the first trench;
    implanting impurities into the side face of the second region by implanting ions into the first trench and second trench in a direction deviating from a normal line to the bottom face by an acute angle to the side face;
    forming a first element isolating region by burying a first insulating film in the first trench;
    forming a second element isolating region by burying a second insulating film in the second trench;
    removing the mask material after forming the first element isolating region and second element isolating region;
    forming a third insulating film on the first conductive layer;
    forming a second conductive layer on the third insulating film; and
    forming the memory cell transistor and peripheral transistor by patterning the second conductive layer, first insulating film, first conductive layer, first gate insulating film, and second gate insulating film.

2. The method according to claim 1, wherein a width of the first trench is S and a height from the surface of the semiconductor substrate to a top face of the mask material is H, the ion implantation is performed in a direction deviating from the normal line by an angle of $\theta \geq \tan^{-1}(S/H)$.

3. The method according to claim 1, wherein the ion implantation is performed at an angle at which no impurity is implanted into the first region, and when the side face of the second region is charged positively after the formation of the second trench, the impurities in the ion implantation are p-type impurities, and when the side face of the second region is charged negatively, the impurities in the ion implantation are n-type impurities.

4. The method according to claim 3, wherein the p-type impurities implanted into the side face of the second region are boron, boron fluoride, boron difluoride, aluminum, or gallium, and the n-type impurities are phosphorus or arsenic.

5. The method according to claim 1, wherein the impurity concentration of the p-type impurities is $10^{11}$ to $10^{13}$ [ion/cm$^2$].

6. The method according to claim 1, wherein the second region includes a first to a fourth side face facing the second trench, the first side face having a normal line in a negative direction of the y-axis, the second side face having a normal line in a positive direction of the x-axis perpendicular to the y-axis and making contact with the first side face, the third side face having a normal line in a positive direction of the y-axis and making contact with the second side face, the fourth side face having a normal line in a negative direction of the x-axis and making contact with the first side face and third side face, and as a result of the ion implantation, the impurity concentration in a central part of the second region is made lower than that in the first to fourth side faces of the second region has, and the impurity concentration in a central part of the first region is equal to the impurity concentrations in the first to fourth side faces the first region has.

7. The method according to claim 1, wherein the second region includes a first to a fourth side face facing the second trench, the first side face having a normal line in a negative direction of the y-axis, the second side face having a normal line in a positive direction of the x-axis perpendicular to the y-axis and making contact with the first side face, the third side face having a normal line in a positive direction of the y-axis and making contact with the second side face, the fourth side face having a normal line in a negative direction of the x-axis and making contact with the first side face and third side face, and the implanting impurity includes implanting ions in a direction deviating not only from a normal line to the bottom face by an acute angle to the side face but also from a positive normal line of the x-axis by an angle of 45° to a positive normal line of the y-axis, implanting ions in a direction deviating not only from a normal line to the bottom face by an acute angle to the side face but also from a positive normal line of the x-axis by an angle of 135° to a positive normal line of the y-axis, and implanting ions in a direction deviating not only from a normal line to the bottom face by an acute angle to the side face but also from a positive normal line of the x-axis by an angle of 225° to a positive normal line of the y-axis, and implanting ions in a direction deviating not only from a normal line to the bottom face by an acute angle to the side face but also from a positive normal line of the x-axis by an angle of 315° to a positive normal line of the y-axis.

8. The method according to claim 1, wherein the second region includes a first to a fourth side face facing the second trench, the first side face having a normal line in a negative direction of the y-axis, the second side face having a normal line in a positive direction of the x-axis perpendicular to the y-axis and making contact with the first side face, the third side face having a normal line in a positive direction of the y-axis and making contact with the second side face, the fourth side face having a normal line in a negative direction of the x-axis and making contact with the first side face and third side face, the implanting impurity includes implanting ions in a direction deviating not only from a normal line to the bottom face by an acute angle to the side face but also from a positive normal line of the x-axis by an angle of 45° to a positive normal line of the y-axis, and implanting ions in a direction deviating not only from a normal line to the bottom face at an acute angle to the side face but also from a positive normal line of the x-axis at by angle of 225° to a positive normal line of the y-axis.

* * * * *